United States Patent [19]

Kinoshita et al.

[11] Patent Number: 5,341,031
[45] Date of Patent: Aug. 23, 1994

[54] STABLE HIGH SPEED CLOCK GENERATOR

[75] Inventors: Itsuko Kinoshita; Masayuki Hata; Mitsugu Satou, all of Itami, Japan

[73] Assignee: Mitsubishi Denki Kabushiki Kaisha, Tokyo, Japan

[21] Appl. No.: 751,238

[22] Filed: Aug. 26, 1991

[30] Foreign Application Priority Data

Aug. 27, 1990 [JP] Japan .................. 2-225483
Nov. 28, 1990 [JP] Japan .................. 2-335326

[51] Int. Cl.⁵ .............. H03K 5/13; H03K 7/00; H03K 3/29
[52] U.S. Cl. ............ 307/269; 307/272.1; 307/590; 307/595; 307/602; 307/605; 328/55; 328/63; 328/72
[58] Field of Search .......... 307/269, 480, 272.1, 307/262, 290, 590, 595, 602, 605; 328/63, 72, 133, 55

[56] References Cited

U.S. PATENT DOCUMENTS

| | | | |
|---|---|---|---|
| 4,471,299 | 9/1984 | Elmis | 307/269 |
| 4,628,269 | 12/1986 | Hunninghaus et al. | 307/269 |
| 4,656,649 | 4/1987 | Takahashi | 307/269 |
| 4,700,350 | 10/1987 | Douglas et al. | 307/269 |
| 4,758,737 | 7/1988 | Hirano | 307/269 |
| 4,761,568 | 8/1988 | Stronski | 307/269 |
| 4,816,700 | 3/1989 | Imel | 307/269 |
| 4,929,854 | 5/1990 | Iino et al. | 307/269 |
| 4,940,904 | 7/1990 | Lin | 307/269 |
| 4,975,593 | 12/1990 | Kurakazu et al. | 307/269 |
| 4,985,640 | 1/1991 | Grochowski et al. | 307/269 |

FOREIGN PATENT DOCUMENTS

276327  11/1989  Japan .

OTHER PUBLICATIONS

"Non–Overlapping Clock Generator", IBM Technical Disclosure Bulletin, vol. 29, No. 1, Jun. 1986, pp. 263–264.
i82384 Data Book, Intel, Nov. 1986, pp. 4–127.

*Primary Examiner*—Timothy P. Callahan
*Assistant Examiner*—Trong Phan

[57] ABSTRACT

A clock generator which is provided with a circuit generating non-overlap clock from input clock, a frequency dividing circuit driven by the non-overlap clock and a latch disposed between the frequency dividing circuit and a clock driver, and whose critical pass being a cause of delay is shortened by sampling the frequency-divided output into the latch by the input clock and thereafter driving it by the clock driver, and a clock generator in which an internal clock at high speed in the internal clock logical value generating circuit is added with internal clock edge generating circuit required to operate at high speed and an output of initial stage of a buffer for inputting external clock is divided to supply to the internal clock edge generating circuit and to the other circuits, thereby capacity of the buffer required to operate at high speed in the circuit is decreased to reduce the delay of external clock.

10 Claims, 21 Drawing Sheets

Fig. 6(a) Prior Art EXTERNAL CLOCK 1
Fig. 6(b) Prior Art 1st CLOCK C1
Fig. 6(c) Prior Art 2nd CLOCK C2
Fig. 6(d) Prior Art 3rd CLOCK C3
Fig. 6(e) Prior Art 4th CLOCK C4
Fig. 6(f) Prior Art 5th CLOCK C5
Fig. 6(g) Prior Art 6th CLOCK C6
Fig. 6(h) Prior Art 1st INTERNAL CLOCK IC1
Fig. 6(i) Prior Art 2nd INTERNAL CLOCK IC2

Fig. 14(a) EXTERNAL CLOCK 1
Fig. 14(b) NON-OVERLAP CLOCK 21
Fig. 14(c) NON-OVERLAP CLOCK 21'
Fig. 14(d) FREQUENCY-DIVIDED CLOCK 22
Fig. 14(e) FREQUENCY-DIVIDED CLOCK 22'
Fig. 14(f) 1st INTERNAL CLOCK IC1
Fig. 14(g) 2nd INTERNAL CLOCK IC2

Fig. 19(a) EXTERNAL CLOCK 1
Fig. 19(b) 1st CLOCK C1
Fig. 19(c) 2nd CLOCK C2
Fig. 19(d) 3rd CLOCK C3
Fig. 19(e) 4th CLOCK C4
Fig. 19(f) 5th CLOCK C5
Fig. 19(g) 6th CLOCK C6
Fig. 19(h) 7th CLOCK C7
Fig. 19(i) 8th CLOCK C8
Fig. 19(j) 1st INTERNAL CLOCK IC1
Fig. 19(k) 2nd INTERNAL CLOCK IC2

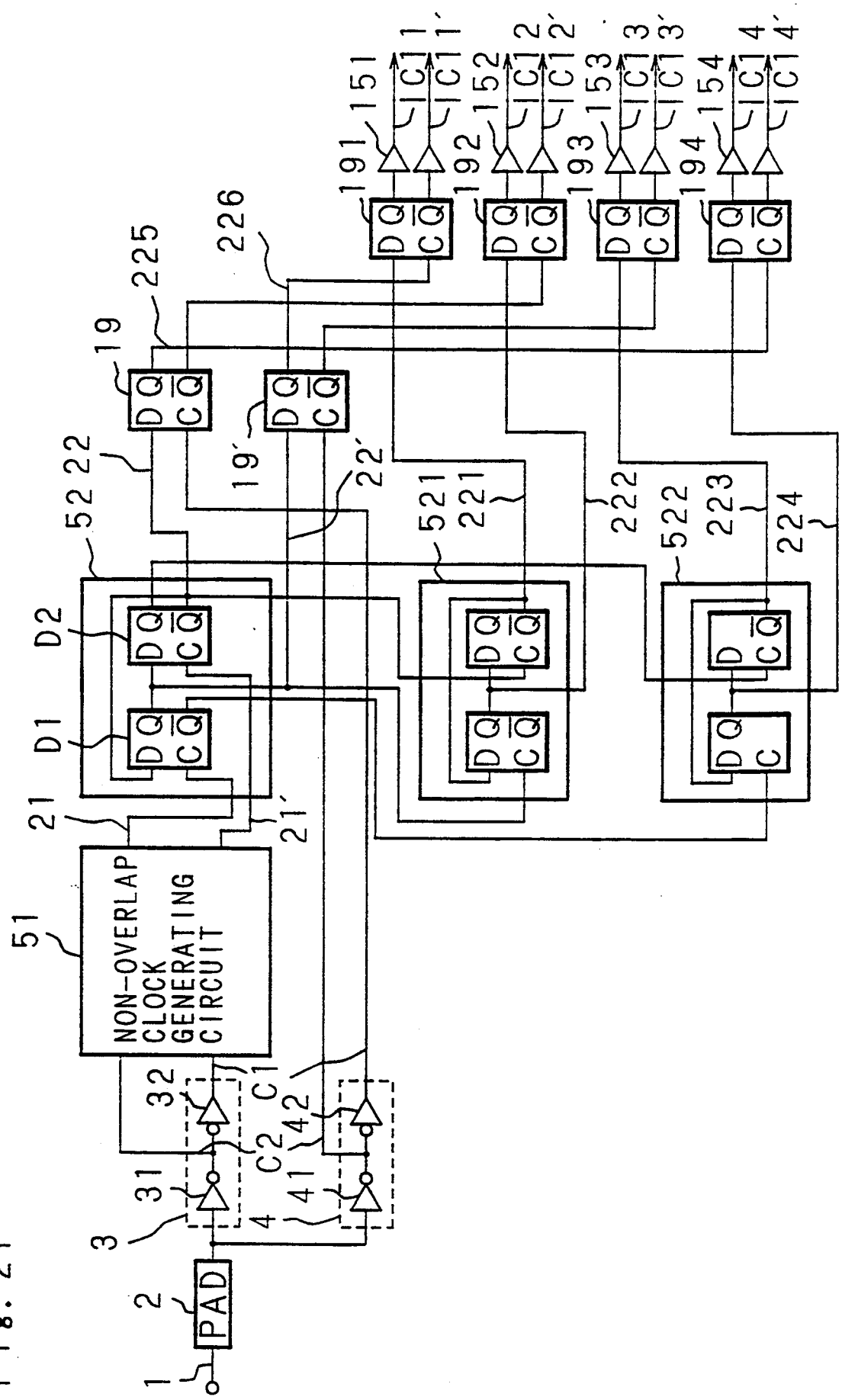

STABLE HIGH SPEED CLOCK GENERATOR

BACKGROUND OF THE INVENTION

1. Field of the Invention

The present invention relates to a clock generator in a semiconductor system using semiconductor integrated circuit and semiconductor integrated circuit element, and to a clock generator which enables the high speed operation thereof by decreasing delay between the input clock and output clock.

2. Description of Related Art

FIG. 1 is a block diagram of an example of construction of a conventional clock generator.

In FIG. 1, reference numeral 61 designates a crystal oscillating circuit (CO), 62 a multiplexer, 63 a frequency dividing circuit, 64 a clock driver, 65 an RES# signal synchronizing circuit, and 66 an ADS# signal synchronizing circuit. Moreover, reference numeral 67 designates a quartz resonator connecting terminal, 68 an external clock signal input terminal, 69 a clock (CLK2) signal output terminal, 70 a clock (CLK) signal output terminal, 71 a clock signal source selecting terminal, 72 an RES# signal input terminal, 73 a RESET signal output terminal, 74 an ADS# signal input terminal, and 75 an AD50 signal output terminal.

Next, explanation will be given on an operation of a conventional clock generator of a construction mentioned above.

A quartz resonator having oscillating frequency being equal to clock frequency expected to be outputted from the clock (CLK2) signal output terminal 69 is connected with the quartz resonator connecting terminal 67, and an external clock signal is connected with the external clock signal input terminal 68 respectively as clock signal sources. And in the case where the clock signal source selecting terminal 71 is set at low level, the terminal 68 is selected as clock signal source, and in the case where it is set at high level, the terminal 67 is selected respectively by the multiplexer 62. The clock signal source selected by the multiplexer 62 is outputted therefrom to be inputted to the clock driver 64 and driven from the clock (CLK2) signal output terminal 69.

On the other hand, the clock signal source outputted from the multiplexer 62 is inputted to the frequency dividing circuit 63, and driven from the clock (CLK) signal output terminal 70 after the frequency thereof being divided into two.

In addition, explanation on operations of the RES# signal synchronizing circuit 65 and the ADS# signal synchronizing circuit 66 will be omitted as there is no direct relation with the present invention.

Moreover, as shown in the block diagram in FIG. 1, although a non-overlap clock is widely used in order to prevent malfunctioning due to lacing of data, as a clock for driving the ½ frequency dividing circuit usually comprising flip-flop of two stages, the clock and the generating circuit thereof are omitted.

FIG. 2 shows a block diagram showing a construction of a conventional clock generator being provided with the non-overlap clock generating circuit 76.

In the case where the construction of the clock generator is that of the block diagram in FIG. 2, the clock signal source outputted from the multiplexer 62 is inputted to the non-overlap clock generating circuit 76. The non-overlap clock generating circuit 76 generates clock signal 77 of two-phase having non-overlap period from the inputted clock signal source. And the frequency dividing circuit 63 is not directly driven by the output of the multiplexer 62, but is driven by the non-overlap clock 77 generated by the non-overlap clock generating circuit 76.

In addition, other operations are quite the same as those of the clock generator shown in a block diagram in FIG. 1 above-mentioned.

Moreover, as an example of a conventional clock generator, a construction as shown in a block diagram in FIG. 3, for example.

In FIG. 3, reference numeral 1 designates an external clock. The external clock 1 is inputted from a pad 2 to be a first clock C1 through inverters 31 and 32 of two stages of a buffer 3, and to be a second clock C2 directly from the inverter 31, these clocks C1 and C2 respectively being inputted to a non-overlap clock generating circuit 51 of an internal clock logical value generating circuit 5

FIG. 4 is a circuit diagram showing an concrete construction of the non-overlap clock generating circuit 51. Both of the first clock C1 and the second clock C2 having inputted to the non-overlap clock generating circuit 51 are inputted to the frequency dividing circuit 52 as a fourth clock C4 and a third clock C3 through NOR gates and inverters of two stages, respectively.

FIG. 5 is a circuit diagram showing a concrete construction of the frequency dividing circuit 52. The frequency dividing circuit 52 comprises D latches D1 and D2 of two stages. The third clock C3 inputted into the frequency dividing circuit 52 is outputted as sixth clock C6 through one D latch D1 and the fourth clock C4 inputted into the frequency dividing circuit 52 is outputted as a fifth clock C5 through the other D latch D2, respectively.

The fifth clock C5 is outputted as a second internal clock IC2 through an inverter 18 and an internal clock outputting buffer 15'. On the other hand, the sixth clock C6 is outputted as a first internal clock IC1 only through an internal clock outputting buffer 15.

FIG. 6 is a timing chart showing a waveform of above-mentioned each clock.

Compared with the external clock 1 shown in FIG. 6(a), the second clock C2 through the inverter 31 of the buffer 3 is inverted and delayed a little, as shown in FIG. 6(c), and the first clock C1 through inverters 31 and 32 of two stages of the buffer 3 is inverted two times and delayed about two times of the second clock C2, as shown in FIG. 6(b).

The fourth clock C4 shown in FIG. 6(e) is delayed by the time required for the first clock C1 passing through one NOR gate and two inverters from C1, and the third clock C3 shown in FIG. 6(d) is generated in the non-overlap state with the fourth clock C4.

And the sixth clock C6 shown in FIG. 6(g) is generated from the third clock C3 due to delay corresponding to one D latch, and the first internal clock IC1 is generated shown in FIG. 6(h) from the sixth clock C6 due further to delay of time to pass one internal clock output buffer 15.

Accordingly, time delay shown by Td in FIG. 6 is generated between the external clock 1 shown in FIG. 6(a) and the first internal clock IC1 shown in FIG. 6(h).

In the above-mentioned first conventional clock generator, until the frequency-divided clock is generated from the clock signal source outputted from the multiplexer 62 and is outputted, it is to be through the frequency dividing circuit 63 in the case of the construction example, shown in FIG. 1, or is to be through the frequency dividing circuit 63 and non-overlap clock generating circuit 73 in the case of the construction example shown in FIG. 2, in which the frequency dividing circuit 52 is driven by the non-overlap clock 17. That is to say, the critical pass between the inputted external clock being the source clock signal and the output clock is;

external clock→
    non-overlap signal generating circuit 51→
    frequency dividing circuit 52→
    clock driver 15.

Especially, as the non-overlap clock generating circuit 51 is composed generally of a chain of gates, the delay thereof is made large as a necessary consequence. Accordingly, there is a problem that the time delay between input clock (external clock) and output clock is made large.

In addition, also when the second conventional clock generator is used, a large time delay shown by Td in FIG. 6 is generated.

Next, explanation will be given on Japanese Patent Application Laid-Open No. 1-276327 (1989) as a third conventional example of a clock generator referring to drawings thereof.

FIG. 7 is a block diagram showing a construction of a clock generator disclosed in aforementioned Japanese Patent Application Laid-Open No. 1-276327 (1989).

In FIG. 7, reference numeral 101 designates an input terminal of a reference clock, 102 a D flip-flop functioning as a ½ frequency divider, 103 a D flip-flop, 104 a set/reset flip-flop, and 105 designates a D latch.

Numerals 109 and 110 designate clock output terminals and respectively output ½ frequency-divided clock and 1 frequency-divided clock of reference clocks inputted to the clock input terminal 101. A reference numeral 106 designates an input buffer, and 107, 108 designate output buffers.

The reference clock inputted from the clock input terminal 101 is given to clock input CK of the D flip-flop 102 and to D input of the D latch 105 through the input buffer 106.

$\overline{Q}$ output of the D flip-flop 102 is connected to D input of the D flip-flop 102 itself and Q output to D input of the D flip-flop 103, and Q output of the D flip-flop 103 is outputted to the output terminal 109 through the output buffer 107.

Q output and $\overline{Q}$ output of the D latch 105 are respectively outputted to S input and R input of the set/reset flip-flop 104. And Q output of the set/reset flip-flop 104 is outputted to the output terminal 110 through the output buffer 108.

By the way, explanation will be given in the following on the D flip-flops 102 and 103 used in a clock generator of such a construction as above-mentioned, referring to a circuit diagram of FIG. 8 showing circuit construction of the D flip-flops 102 and 103.

In FIG. 8, reference numeral 901 designates a D input terminal inputting data, 902 a CK terminal inputting clock, 903 and 904 a Q output terminal and $\overline{Q}$ output terminal respectively, and 905 and 906 inverters, 907 an NAND gate, 908 through 910 OR-NAND gates respectively in each of which an OR gate and an NAND gate are integrated.

Here, logical relation among the D input terminal 901, CK input terminal 902, Q output terminal 903, and $\overline{Q}$ output terminal 904 is a so called rising edge trigger D flip-flop, and expressed in relation shown in Table 1.

TABLE 1

| D | CK | Q | $\overline{Q}$ |
|---|---|---|---|
| 1 | 0 → 1 | 1 | 0 |
| 0 | 0 → 1 | 0 | 1 |
| X | OTHER THAN ABOVE | Q | $\overline{Q}$ |

In addition, the D flip-flops 102 and 103 shown in FIG. 7 is respectively so constructed that the OR-NAND gate 908 and the inverter 906 shown in FIG. 8 may function as a set/reset flip-flop of input stage, and the OR-NAnd gates 909 and 910 may function as a set/reset flip-flop of output stage. The operation of the D flip-flops 102 and 103 of a construction shown in FIG. 8 is as follows.

(1) in the case where input to the CK input terminal 902 is "0".

As output of the inverter 905 is "1", OR input of the OR-NAND gates 909 and 910 in the set/reset flip-flop of output stage is "1", and there is no new input, the output state in the past will be maintained. Accordingly, values of Q output terminal 903 and $\overline{Q}$ output terminal 904 do not change. In the set/reset flip-flop of input stage, as the NAND gate 907 turns into ON state, the state of the D input terminal 901 is taken in the OR-NAND gate 908 and the reversed value thereof becomes output of the inverter 906. But one OR input of the OR-NAND gate 908 is in "1" state of the inverter 905, the set/reset flip-flop of input stage is not in a holding state.

(2) in the case where input to the CK input terminal 902 changes from "0" to "1".

The output of the inverter 905 changes from "1" to "0". Therefore, the NAND gate 907 changes from ON state to OFF state and the set/reset flip-flop of input stage takes in the state of the D input terminal 901 being immediately before the change to the OR-NAND gate 908, and the NAND gate 907 shifts to a holding state. On the other hand, in the set/reset flip-flop of output stage, as OR inputs of the OR-NAND gates 909 and 910 change from "1" to "0", the state of the set/reset flip-flop of input stage are taken in to be outputted to the Q output terminal 903 and $\overline{Q}$ output terminal 904.

(3) in the case where input to the CK input terminal 902 is "1".

As the NAND gate 907 becomes OFF state, new data is not taken in.

(4) in the case where input to the CK input terminal 902 changes from "1" to "0".

The NAND gate 907 changes from OFF state to ON state, thereby OR inputs of the NAND gates 909 and 910 become "1"according to the inverter 905 much faster than the information of the D input terminal 901 is transmitted to these gates. Accordingly, the set/reset flip-flop of output stage becomes a holding state, and outputs from the Q output terminal 903 and $\overline{Q}$ output terminal 904 do not change.

Next, explanation will be given on the D latch 105 referring to a circuit diagram in FIG. 9 showing it circuit construction. In FIG. 9, reference numeral 801 designates a D input terminal inputting data, 802 a C input terminal inputting enable signal, 803 and 804 a Q output terminal and $\overline{Q}$ output terminal respectively outputting data, 805 and 806 OR-NAND gates, and 807 designates an inverter.

Here, logical relation among the D input terminal 801, C input terminal 802, Q output terminal 803, and $\overline{Q}$ output terminal 804 is the one as expressed in Table 2.

TABLE 2

| D | C | Q | $\overline{Q}$ |
|---|---|---|---|
| 1 | 1 | 1 | 0 |
| 0 | 1 | 0 | 1 |
| X | 0 | Q | $\overline{Q}$ |

The operation of the D latch 105 of such a construction as shown in FIG. 9 is as follows.

(1) in the case where input to the C input terminal 802 is "1".

As OR outputs of the OR-NAND gates 805 and 806 are both "1", the information of the D input terminal 801 is transmitted to the Q output terminal 803 through the OR-NAND gates 800 and 806. To the $\overline{Q}$ output terminal 804, the reversed value of the Q output terminal 803 is transmitted through the inverter 807.

(2) in the case where input to the C input terminal. 802 is "0".

A set/reset flip-flop is constructed by the OR-NAND gate 806 and the inverter 807. In the case where the Q output terminal 803 holds "0", as OR input of the OR-NAND gate 805 is "0", the gate 805 becomes OFF state and the information of the D input terminal 801 is not taken in. And in the case where the Q output terminal 803 holds "1", as 0R input of the OR-NAND gate 806 is "0", the information from the OR-NAND gate 805 is not taken in. In either case, regardless of the information of the D input terminal 801, the information before the C input terminal 802 changes its value from "1" to "0" is held at the Q output terminal 803 and the $\overline{Q}$ output terminal 804.

Next, explanation will be given on the set/reset flip-flop 104, referring to a circuit diagram of FIG. 10 showing is circuit construction.

In FIG. 10, reference numeral 701 designates an S input terminal, 702 an R input terminal, 703 a $\overline{Q}$ output terminal, 704 a Q output terminal, and 705 and 706 designates NOR gates.

Here, as the S input terminal 701 and the R input terminal 702 are connected directly with the Q output terminal 704 and $\overline{Q}$ output terminal 703 of the D latch respectively, when one input is "1", the other is "0".

Logical relation among the S input terminal 701, R input terminal 702, Q output terminal 704, and $\overline{Q}$ output terminal 703 is such as expressed in Table 3 according to the NOR gates 705 and 706.

TABLE 3

| S | R | Q | $\overline{Q}$ |
|---|---|---|---|
| 1 | 0 | 1 | 0 |
| 0 | 1 | 0 | 1 |

In the following, explanation will be given on the operation of the third conventional clock generator shown in the block diagram of FIG. 7, referring to a timing chart of FIG. 11.

A waveform shown in FIG. 11(a) is the one of reference clock inputted to the clock input terminal 101, and such a clock is taken in a clock generator constructed on an LSI through the input buffer 106 to be inputted to the CK input terminal of the D flip-flop 102.

In the D flip-flop 102, as $\overline{Q}$ output is connected to D input thereof, every time the waveform shown in FIG. 11(a) changes from "0" to "1", data of reverse polarity to the past is outputted as Q output. This waveform is shown in FIG. 11(b). That is, the D flip-flop 102 functions as a ½ frequency divider.

The Q output terminal of the D flip-flop 102 is given to the CK input of the D flip-flop 103. The output waveform after the output of the D flip-flop 103 passed-through the output buffer 107, that is, ½ frequency-divided clock 109 is shown in FIG. 11(c).

On the other hand, the buffered reference clock by the input buffer 106 is also inputted to D input of the D latch 105. However, as C input of the D latch 105 is fixed to be "1", the Q output thereof becomes to be same waveform (although delayed) as the reference clock as shown in FIG. 11(d).

The waveform shown in FIG. 11(e) is the output waveform of the set/reset flip-flop 104 after passing the output buffer 108. As the set/reset flip-flop 104 is directly connected with the output of the D latch 105, the D input terminal of the D latch 105 is connected with the clock input terminal 101 through the input buffer 106, and the C input terminal of the D latch 105 is fixed to be "1", a waveform shown in FIG. 11(e) is the one of the reference clock shown in FIG. 11(a) being delayed.

By the way, in the aforementioned third conventional clock generator disclosed in Japanese Patent Application Laid-Open No. 1-276327 (1989), although phases of the generated clocks match with each other, the number of gates from the input terminal of the reference clock to the output terminal of the generated clock is large. Therefore, the delay generated clock is large as compared with the reference clock. For example, in the case where internal clock is generated, if a phase difference between external clock (reference clock) and itself is large, a sampling of external signal cannot be performed as desired, leading to much possibility of malfunction.

In addition, the D flip-flop itself has many gates, leading to a problem that a layout area on an LSI becomes large.

SUMMARY OF THE INVENTION

The present invention has been devised in consideration of the problems such conventional clock generator has had, and the primary object thereof is to provide a clock generator which has decreased the time delay between the input clock and output clock without detracting stability from the circuit operation.

Another object of the present invention is to provide a clock generator which can make a layout area to be small in the case where it is constructed on an LSI, and whose occupying area to an LSI substrate is small.

A first invention of the clock generator of the present invention is that a latch means is disposed between the frequency dividing circuit and clock driver, which makes the output clock from the frequency dividing circuit driven by non-overlap clock to be data input and is driven by source input clock signal or inverted clock signal thereof, the output of the latch means being so driven by the source input clock signal or inverted clock signal thereof as to obtain frequency-divided clock. According to such a construction, the critical pass between the input clock signal and output signal is;

input clock→
latch means→
clock driver, which is shorter than that of a conventional clock generator, and moreover the time delay thereof is largely reduced as a non-overlap clock generating circuit whose delay is especially large is not integrated in the critical pass.

And a second invention of the clock generator of the present invention is that external clock signal being input clock inputted by two input buffers, one being inputted to a non-overlap clock generating circuit operating relatively at low speed and the other being directly given to an internal clock edge generating circuit using a latch circuit operating relatively at high speed. According to such a construction, as the external clock signal is directly given to the latch circuit from one of the two input buffers, the latch operation of the latch circuit is performed with little time delay relative to the external clock signal.

The above and further objects and features of the invention will more fully be apparent from the following detailed description with accompanying drawings.

BRIEF DESCRIPTION OF THE DRAWINGS

FIG. 14 is a timing chart showing the state of operation of each signal line of the clock generator of the invention, including also delay element, FIG. 21 is a block diagram showing another example of construction in the case where the output clock of the clock generator of second invention is made to be four-phase.

DESCRIPTION OF THE PREFERRED EMBODIMENTS

In the following, explanation will be given on the present invention referring to drawings showing the embodiments thereof.

At first, explanation will be given on the first invention.

Figure 1:
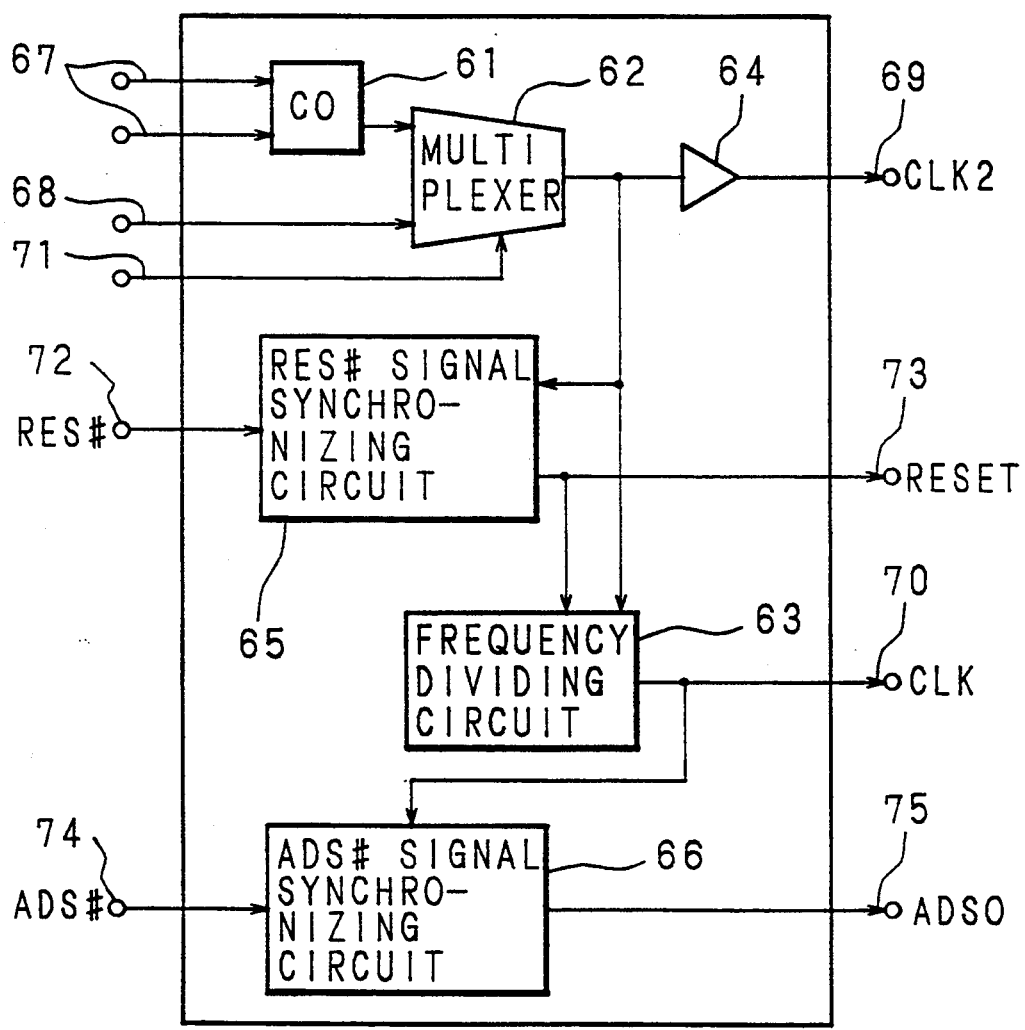
FIG. 1 is a block diagram showing a construction example of a conventional clock generator.
Figure 2:
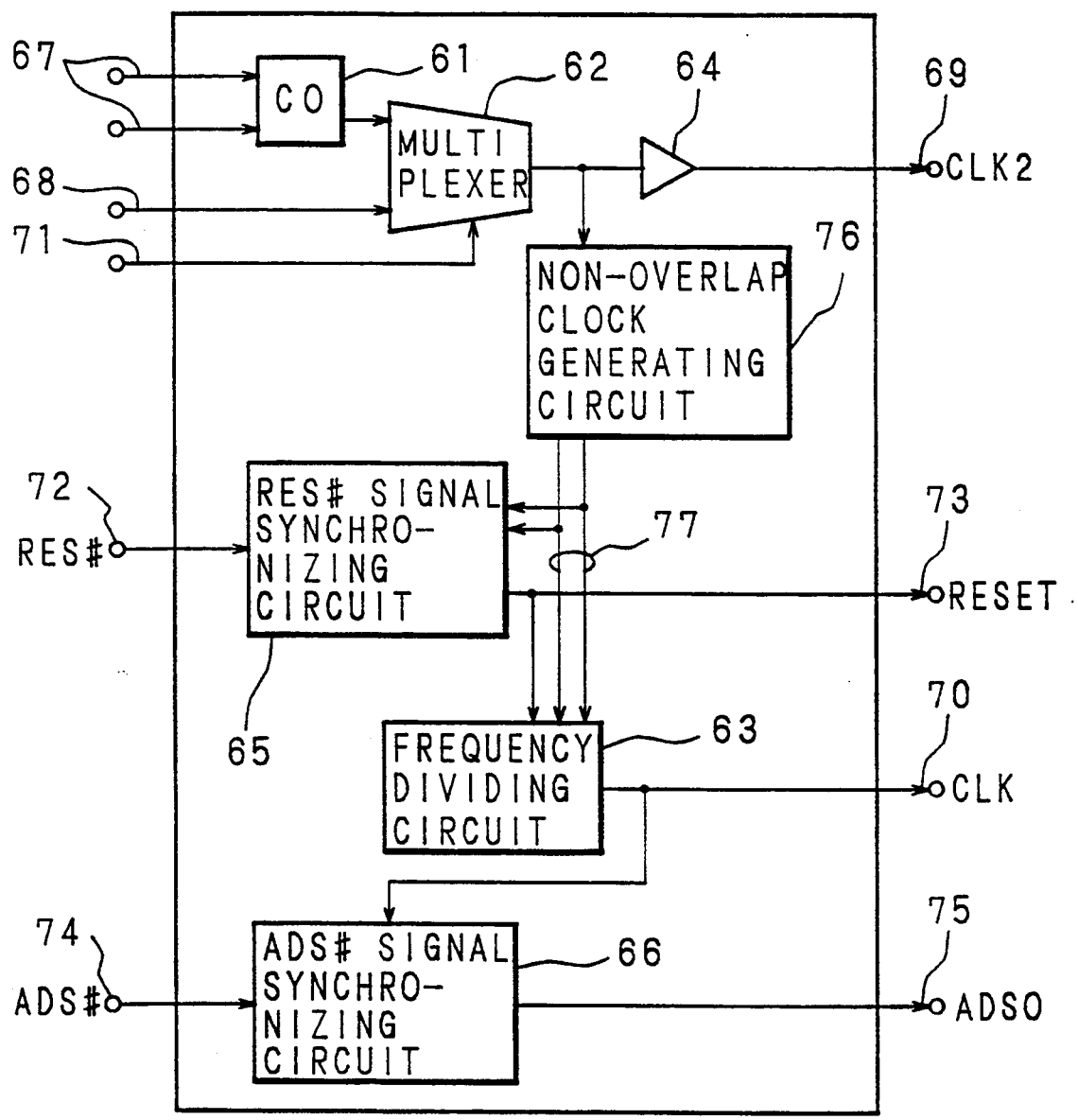
FIG. 2 is a block diagram showing a construction of a conventional clock generator being provided with a non-overlap clock generating circuit.
Figure 3:
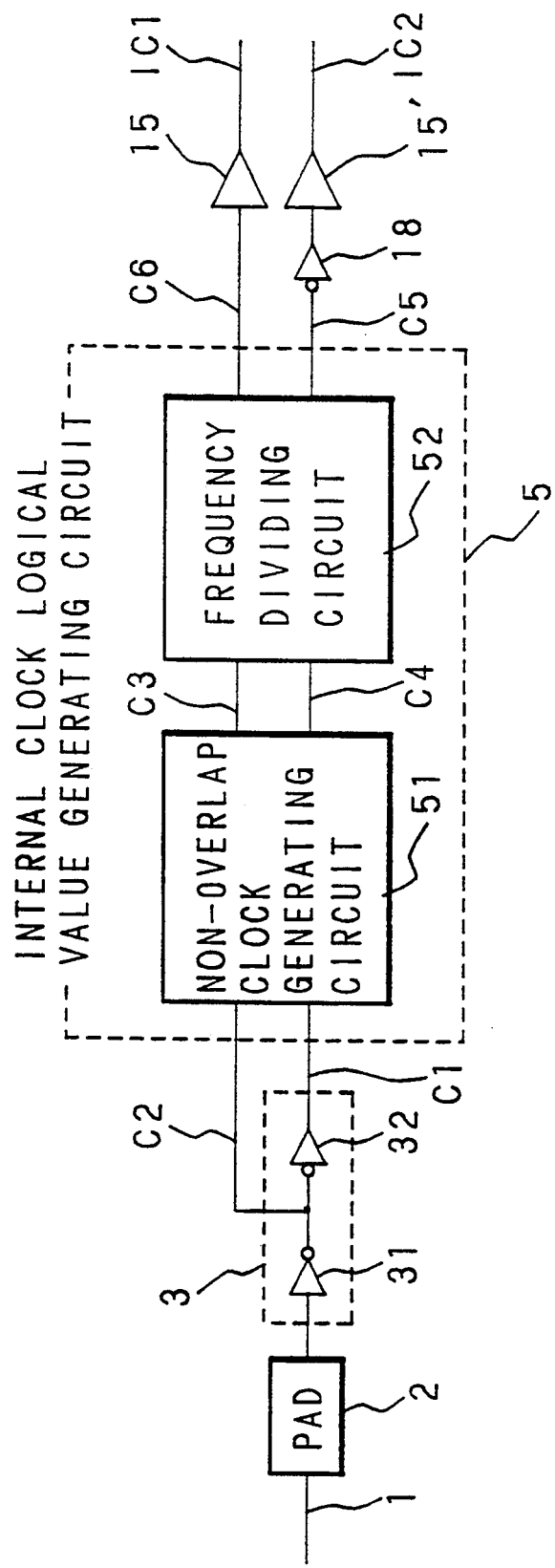
FIG. 3 is a block diagram showing another construction example of a conventional clock generator.
Figure 12:
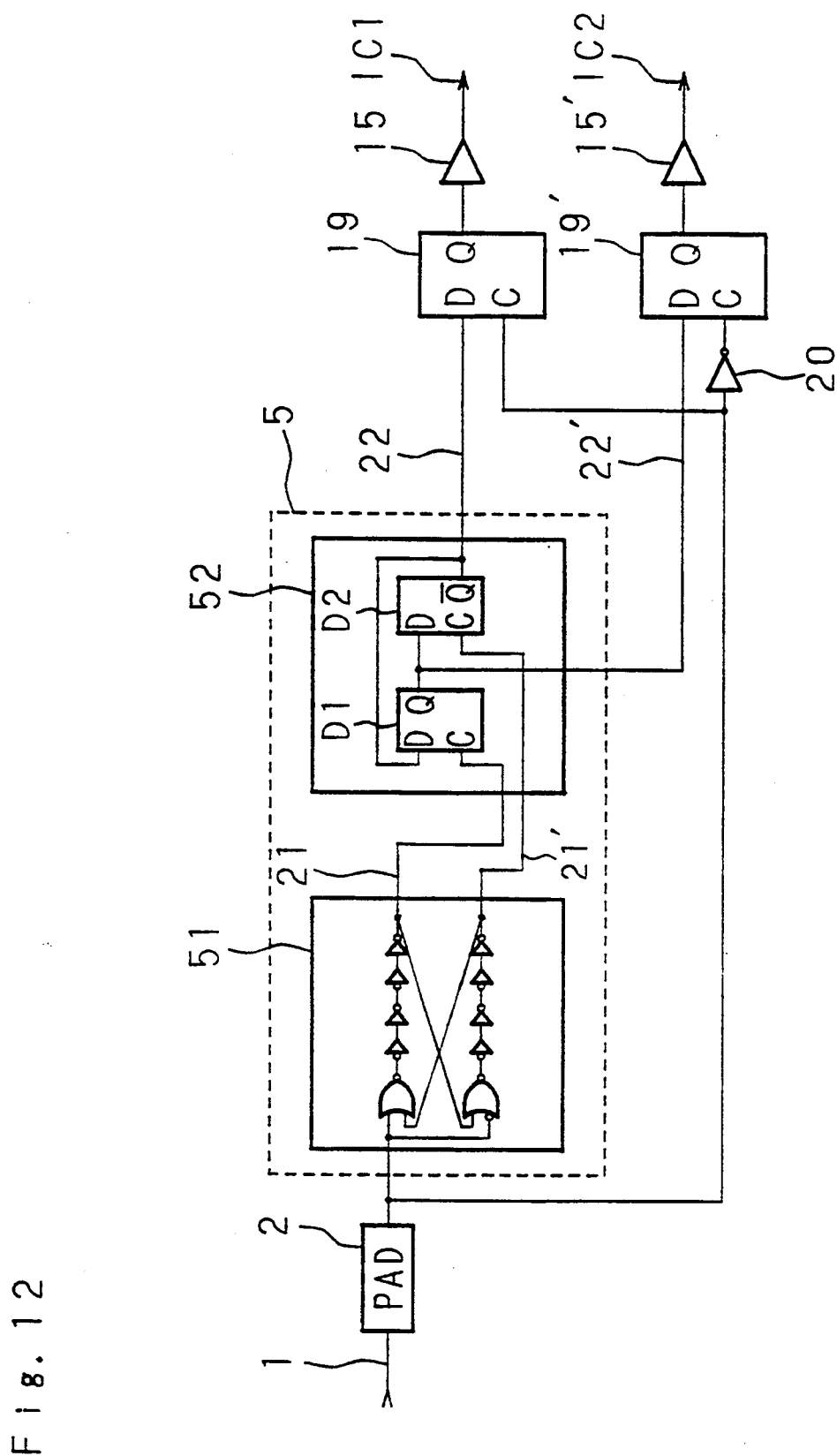
FIG. 12 is a block diagram showing a construction of one embodiment of the first invention of the clock generator related to the invention.

FIG. 12 is a block diagram showing a construction of one embodiment of the first invention, and the portions designated by the same symbols as in FIG. 1, FIG. 2 and FIG. 3 referred for the explanation of the prior art shown the same or corresponding portions.

In FIG. 12, reference numeral 1 designates an external clock, which is inputted from a pad 2 to be inputted to a non-overlap clock generating circuit 51 of an internal clock logical value generating circuit 5.

Figure 4:
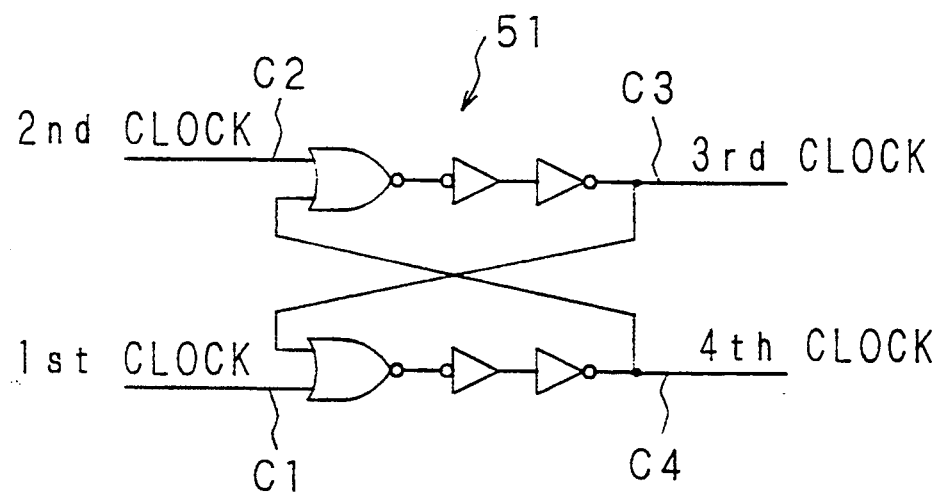
FIG. 4 is a circuit diagram showing a concrete construction of a non-overlap clock generating circuit.

The concrete construction of the non-overlap clock generating circuit 51 is basically the same as that of the conventional one shown in FIG. 4. The external clock 1 inputted to the non-overlap clock generating circuit 51 is outputted to a frequency dividing circuit 52 as non-overlap clocks 21 and 21' through NOR gates and inverters of plural stages.

Figure 5:
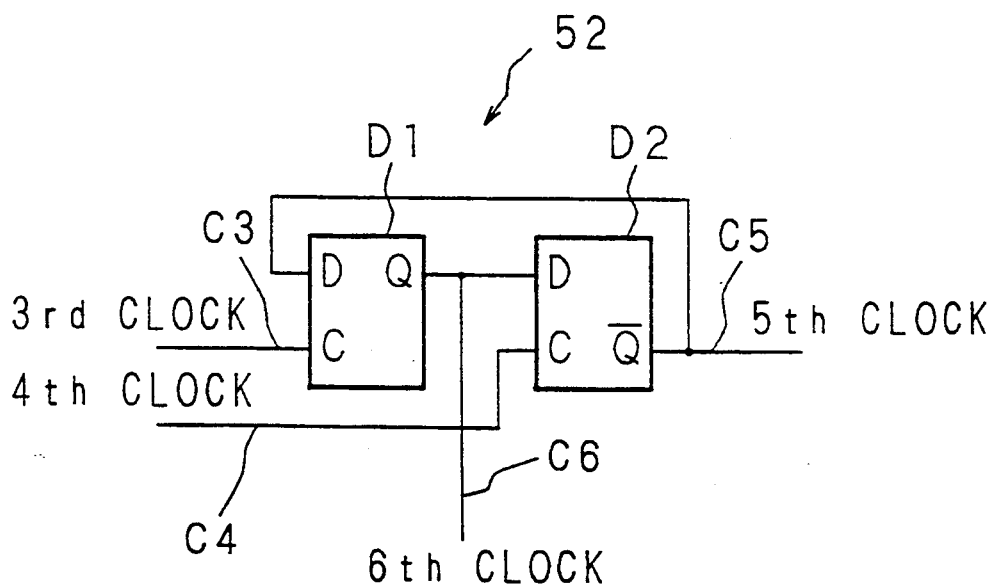
FIG. 5 is a circuit diagram showing a concrete construction of a frequency dividing circuit.
Figure 6:
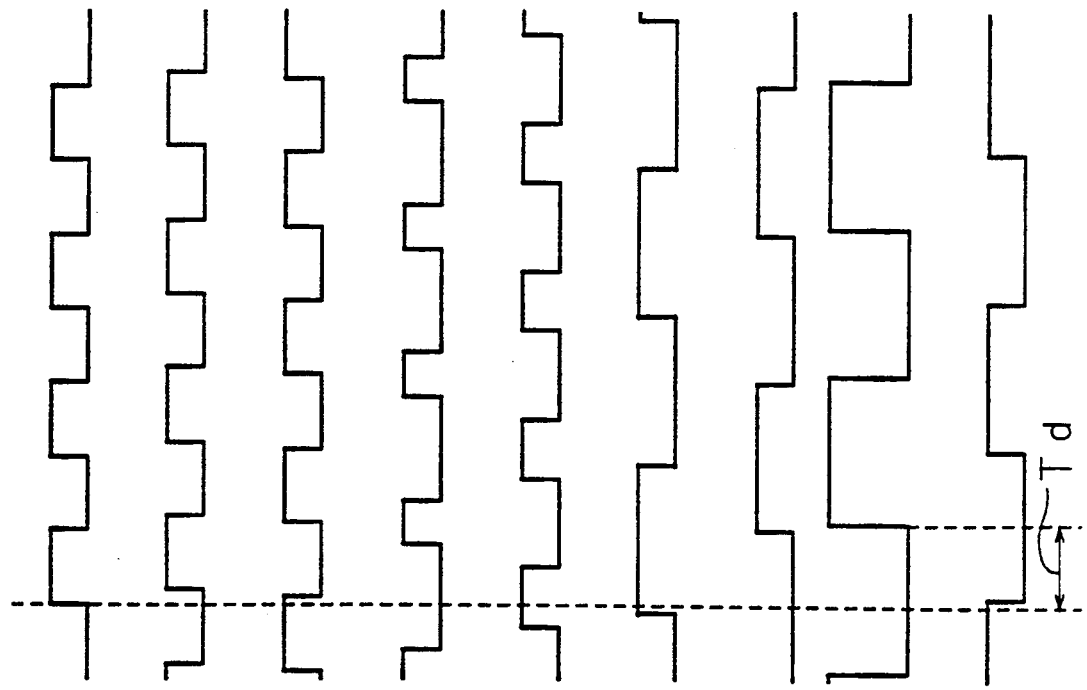
FIG. 6 is a timing chart showing a waveform of each clock above-mentioned.
Figure 7:
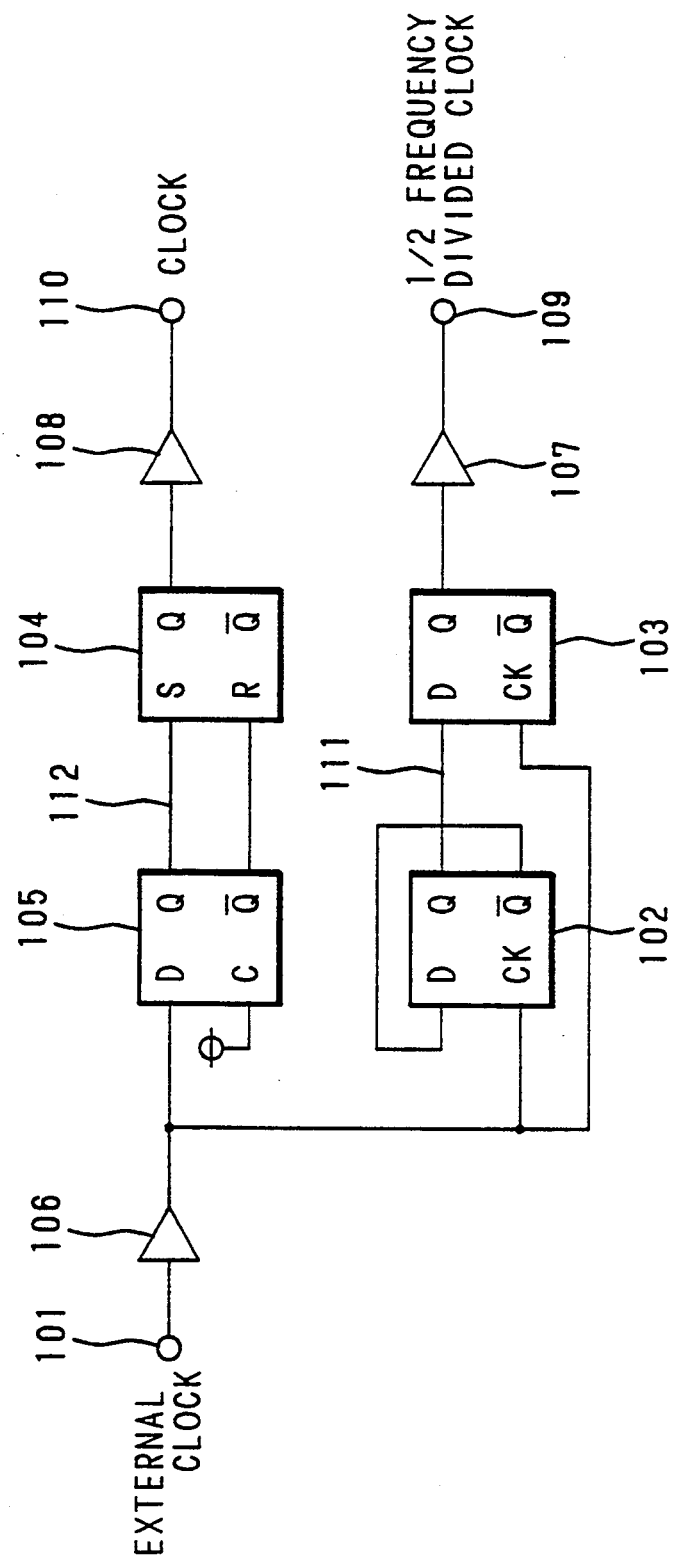
FIG. 7 is a block diagram showing a construction of a clock generator disclosed in Japanese Patent Application Laid-Open No. 1-276327 (1989)
Figure 8:
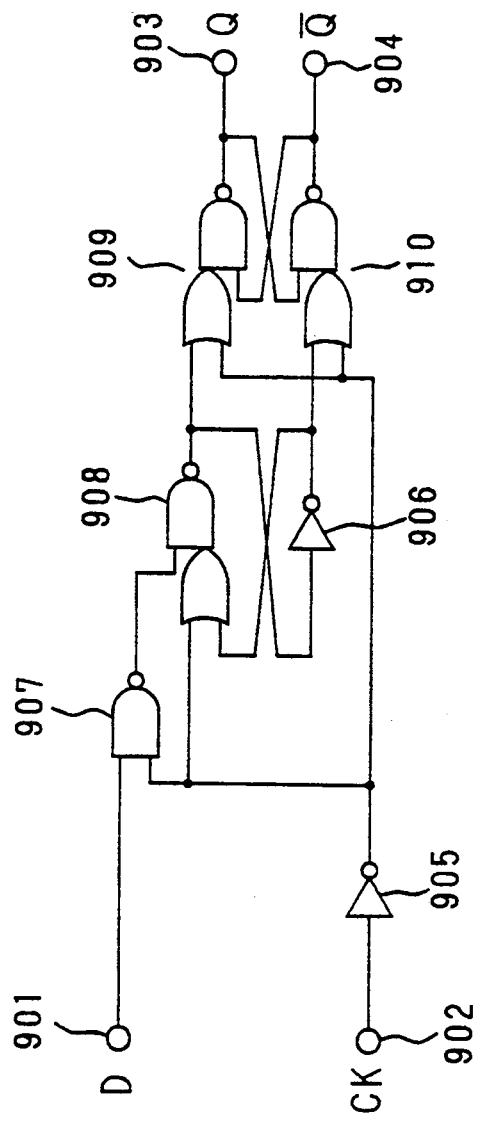
FIG. 8 is a circuit diagram of the D flip-flop used in the clock generator disclosed in Japanese Patent Application Laid-Open No. 1-276327 (1989)
Figure 9:
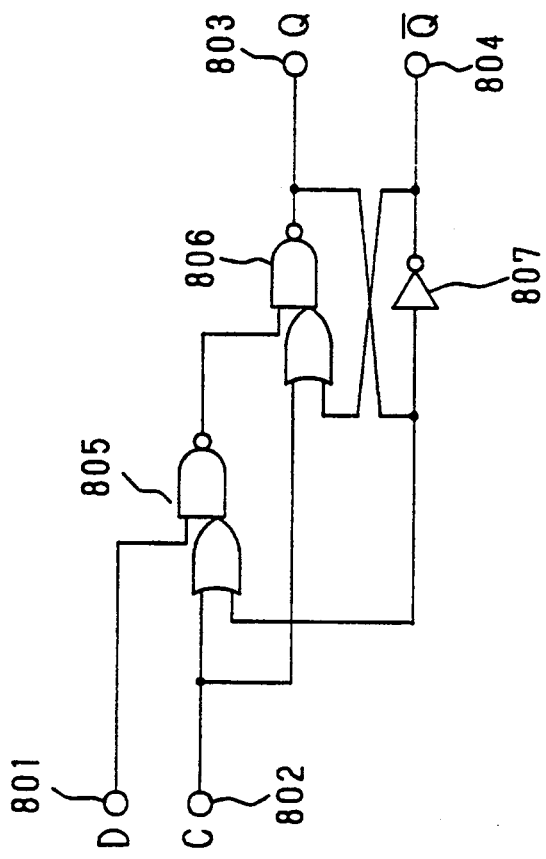
FIG. 9 is a circuit diagram of a D latch used in the clock generator disclosed in Japanese Patent Application Laid-Open No. 1-276327 (1989)
Figure 10:
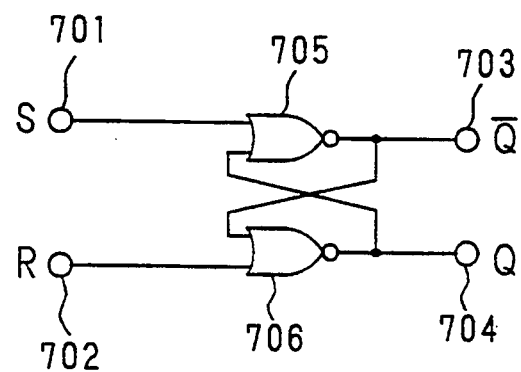
FIG. 10 is a circuit diagram of a set/reset flip-flop used in the clock generator disclosed in Japanese Patent Application Laid-Open No. 1-276327 (1989)
Figure 11:
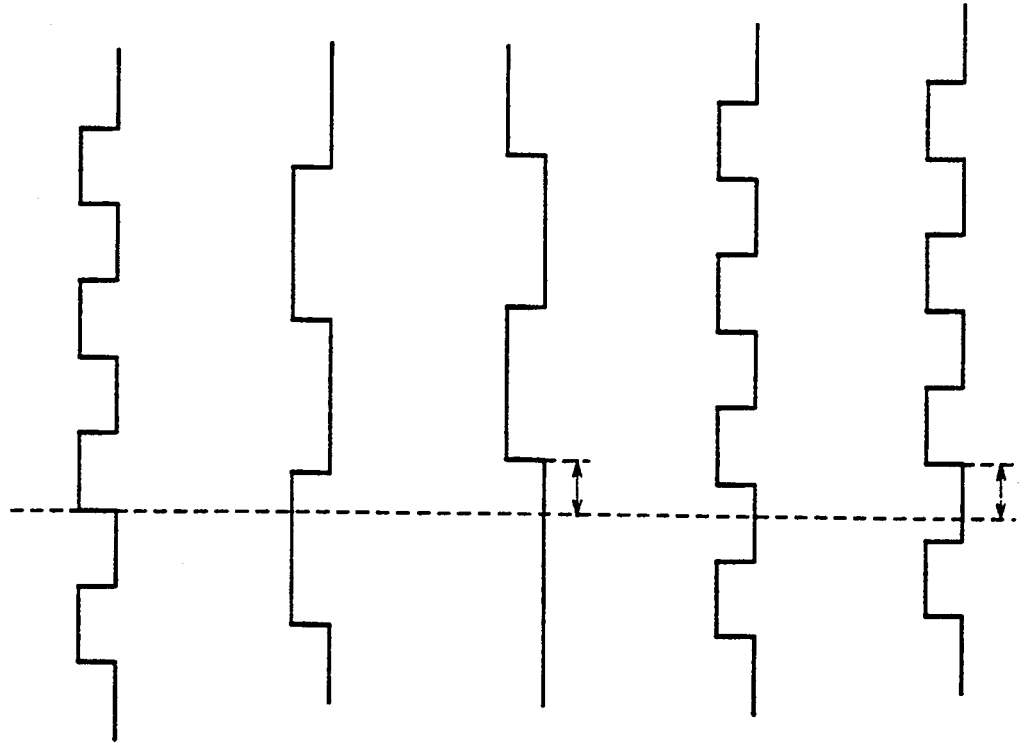
FIG. 11 is a timing chart showing operation of the clock generator disclosed in Japanese Patent Application Laid-Open No. 1-276327 (1989)

The concrete construction of the frequency dividing circuit 52 is basically the same as that of the conventional one shown in FIG. 5. The frequency dividing circuit 52 is composed of D latches D1 and D2 of two stages. The non-overlap clock 21 inputted to the frequency dividing circuit 52 is outputted as a frequency-divided clock 22' through one D latch D1 and the non-overlap clock 21' as a frequency-divided clock 22 through the other D latch D2, respectively.

Figure 13:
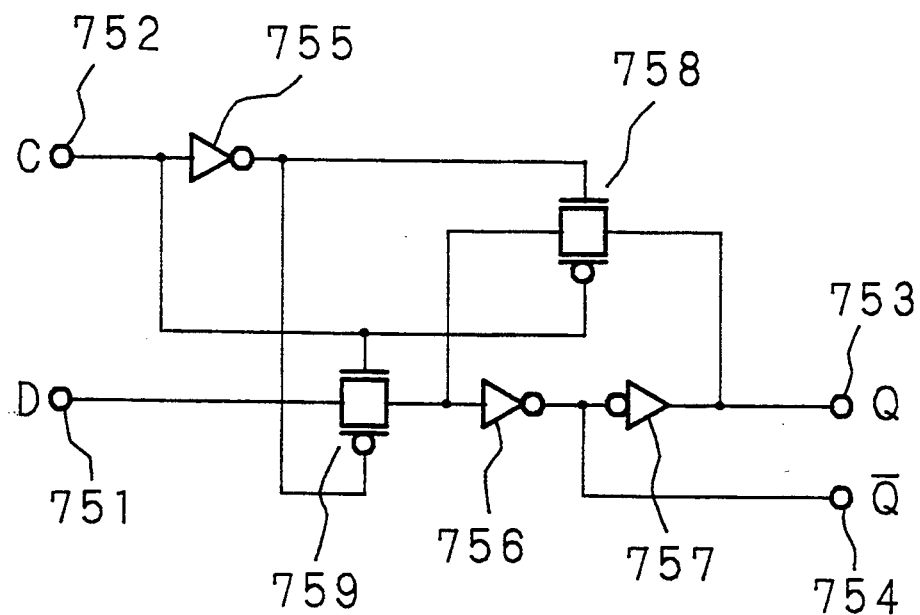
FIG. 13 is a circuit diagram of a D latch used in a clock generator disclosed of the invention.

Here, explanation will be given on the D latches D1 and D2, referring to a circuit diagram of FIG. 13 showing it circuit construction.

In FIG. 13, reference numeral 751 designates a D input terminal inputting data, 752 a C input terminal inputting enable signal, 753 and 754 a Q output terminal and $\overline{Q}$ output terminal respectively outputting data, 755, 756 and 757 inverters and 758 and 759 designate transmission gates.

In addition, logical relation among D input terminal 751, C input terminal 752, Q output terminal 753 and $\overline{Q}$ output terminal 754 is the one expressed in Table 4.

TABLE 4

| D | C | Q | $\overline{Q}$ |
|---|---|---|---|
| 1 | 1 | 1 | 0 |
| 0 | 1 | 0 | 1 |

TABLE 4-continued

| X | 0 | Q | Q̄ |
|---|---|---|---|

The operations of the D latches D1 and D2 are as follows (1) in the case where input to the C input terminal 752 is "1".

The output of the inverter 755 becomes "0", the transmission gate 759 becomes ON state, and the information of the D input terminal 751 is transmitted to the Q̄ output terminal 754 through the inverter 756. To the Q output terminal 753, reversed value of the output of the Q̄ output terminal 754 is transmitted through the inverter 757. On the other hand, the transmission gate 758 becomes OFF state, and data feedback is not generated.

(2) in the case where input to the C input terminal 752 is "0".

The output of the inverter 755 becomes "1", the transmission gate 759 connected to the D input terminal 751 becomes OFF state, and the transmission gate 758 for feedbacking becomes ON state. As the transmission gate 759 is OFF state, new information is not taken in from the D input terminal 751, the past information of the Q output terminal 753 and the Q̄ output terminal 754 is held in the transmission gate 758, inverters 756 and 757, and both of the Q output terminal 753 and Q̄ output terminal 754 do not change.

Returning to FIG. 12, a construction of one embodiment of the first invention of the clock generator related to the present invention will follow. Reference numerals 19 and 19' designate latches, and are composed of the same circuit elements as D latched (D1, D2), which are explained above. Reference numeral 20 designates an inverter, 15 and 15' internal clock output buffers functioning as clock drivers, and IC1 and IC2 a first internal clock and a second internal clock being output clock signals of the clock generator of the invention, respectively.

The frequency-divided clock 22 and 22', which are output from frequency dividing circuit 52, are inputted to D input terminals of the two latches 19 and 19', respectively, and the external clock 1 is directly inputted to a C input terminal of one latch 19 and the external clock 1 after being inverted by the inverter 20 is inputted to a C input terminal of the other latch 19'.

And the output signals from the output terminals of both of the latches 19 and 19' are outputted as the first internal clock IC1 and the second internal clock IC2, respectively, through the internal clock output buffers 15 and 15'.

Next, explanation will be given on the operation of the clock generator of the invention referring to a timing chart shown in FIG. 14. In addition, FIG. 14 shows the operation state of each signal line of the clock generator of the invention, including delay element.

When the external clock signal 1 shown in FIG. 14(a) is inputted into the pad 2, the clock signals 21 and 21', each having non-overlap duration as shown in FIG. 14(b) and FIG. 14(c) are generated by the non-overlap clock generating circuit 51.

The non-overlap clock signals 21 and 21' drive, for example, the frequency dividing circuit 52 comprising D latches D1 and D2 of two stages being same as the conventional one shown in FIG. 4, and the frequency-divided clocks 22 and 22', having phase difference of 90° as shown in FIG. 14(d) and FIG. 14(e) with each other, are generated. And the frequency-divided clock 22 and 22' are sampled in the latches 19 and 19' according to the external clock signal 1 and the signal inverted by the inverter 20, respectively, and outputted as clock outputs, that is, as the first internal clock IC1 and the second internal clock IC2 shown in FIG. 14 (f) and FIG. 14 (g) through the internal clock output buffers 15 and 15'.

In this way, according to the first invention, the latches 19 and 19' are disposed between the frequency dividing circuit 52 and the internal clock output buffers 15 and 15', and the frequency-divided clock 22 and 22' being the outputs of the frequency dividing circuit 52 driven by the non-overlap clock signals 21 and 21' are sampled by the external clock signal 1 being the source input clock or the inverted signal from the inverter 20, thereby the output signals of the latches 19 and 19', after being driven by the internal clock output buffers 15 and 15', are obtained as the first internal clock IC1 and the second internal clock IC2, respectively. Therefore, as clear from FIG. 14, the phases of the first internal clock IC1 and the second internal clock IC2 being respectively the outputs of the internal clock output buffers 15 and 15', are more advanced than those of the frequency-divided clocks 22 and 22' being the outputs of the frequency dividing circuit 52. Accordingly, the delay seen from the clock input 1 is made small, thereby the delay between the input clock and the output clock is reduced.

In addition, as compared with the third conventional example, it employs D latch in place of D flip-flop, thereby the number of gates from clock input to clock output is small, and the delay between input clock and output clock is small as compared with the delay in the third conventional example. And as the number of gates is small as compared with the third conventional example, the layout area can be small-sized, and the occupying area to the substrate when constructed on an LSI becomes small.

Figure 15:
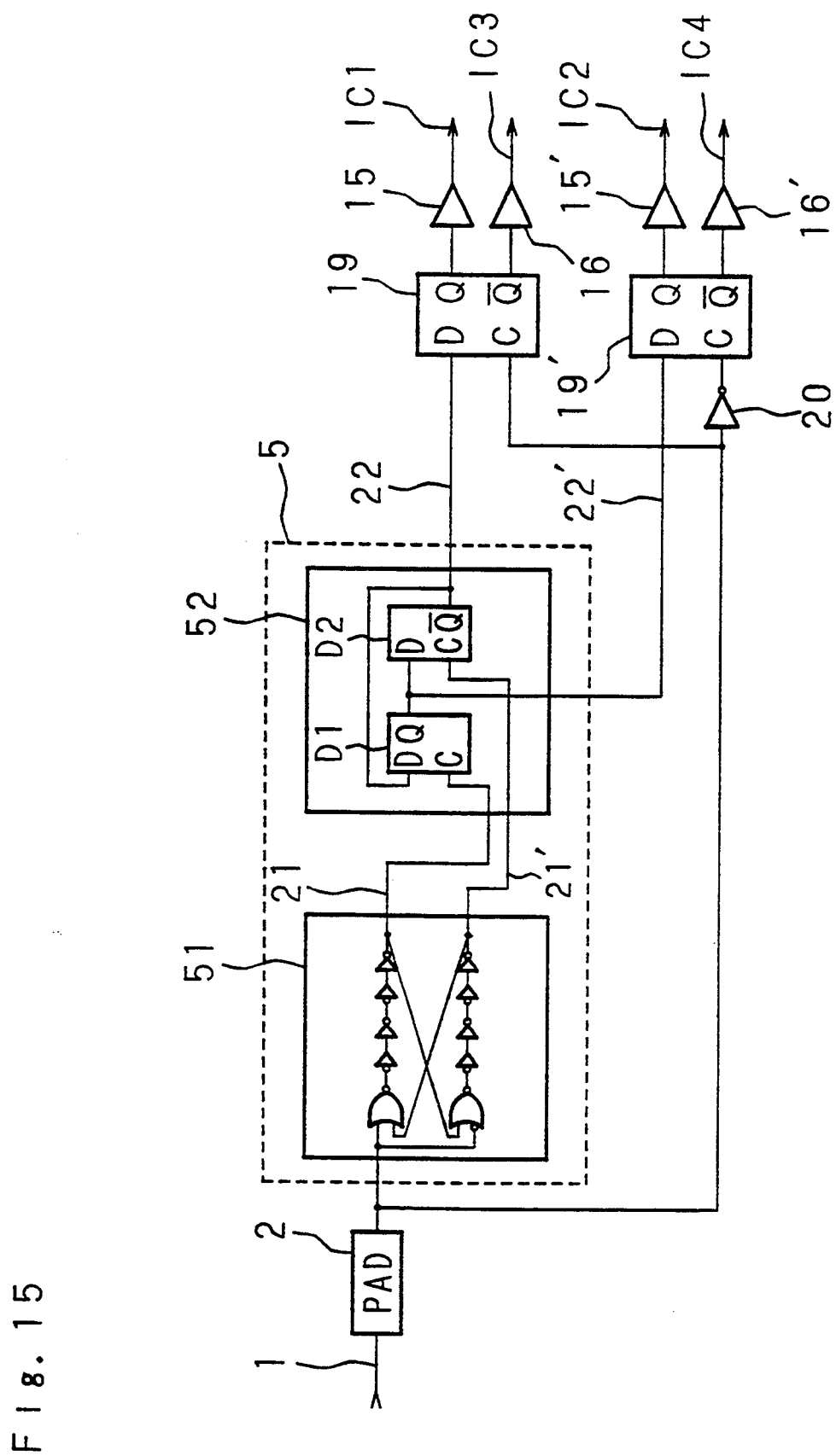
FIG. 15 is a block diagram showing an example of construction in the case where the output clock of the clock generator of first invention is made to be four-phase.

FIG. 15 is a block diagram showing an example of construction in the case where the output clock of the clock generator of aforementioned first invention is made to be four-phase.

In the example of construction shown in the block diagram of FIG. 15, four-phase output clock is obtained by outputting respective Q̄ outputs of the both latches 19 and 19' as third and fourth internal clocks IC3 and IC4 respectively through the output buffers 16 and 16'.

Figure 16:
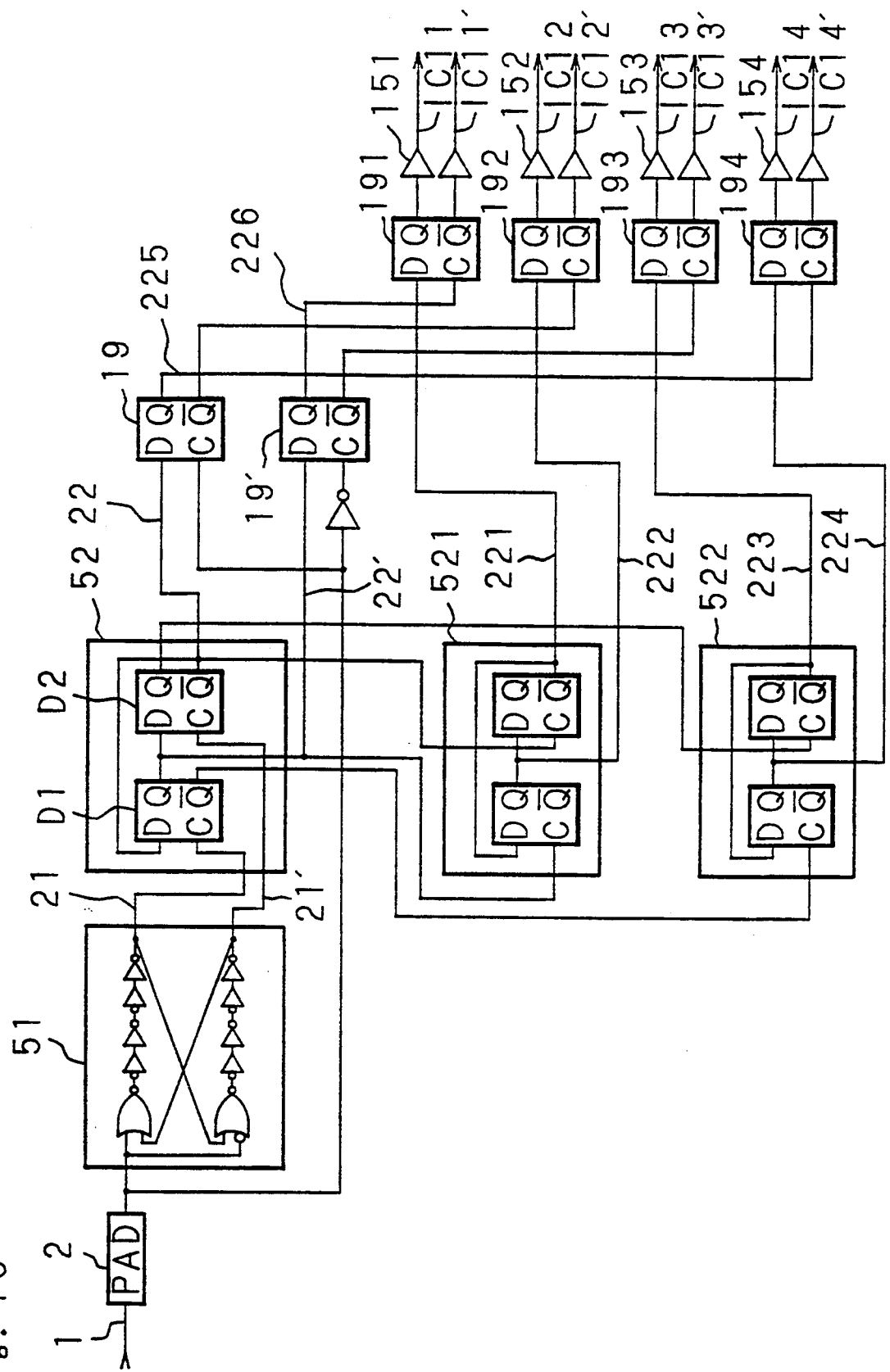
FIG. 16 is a block diagram showing another example of construction in the case where the output clock of the clock generator of first invention is made to be four-phase.

FIG. 16 is a block diagram showing another example of construction in the case where the output clock of the clock generator of aforementioned first invention is made to be four-phase.

Figure 17:
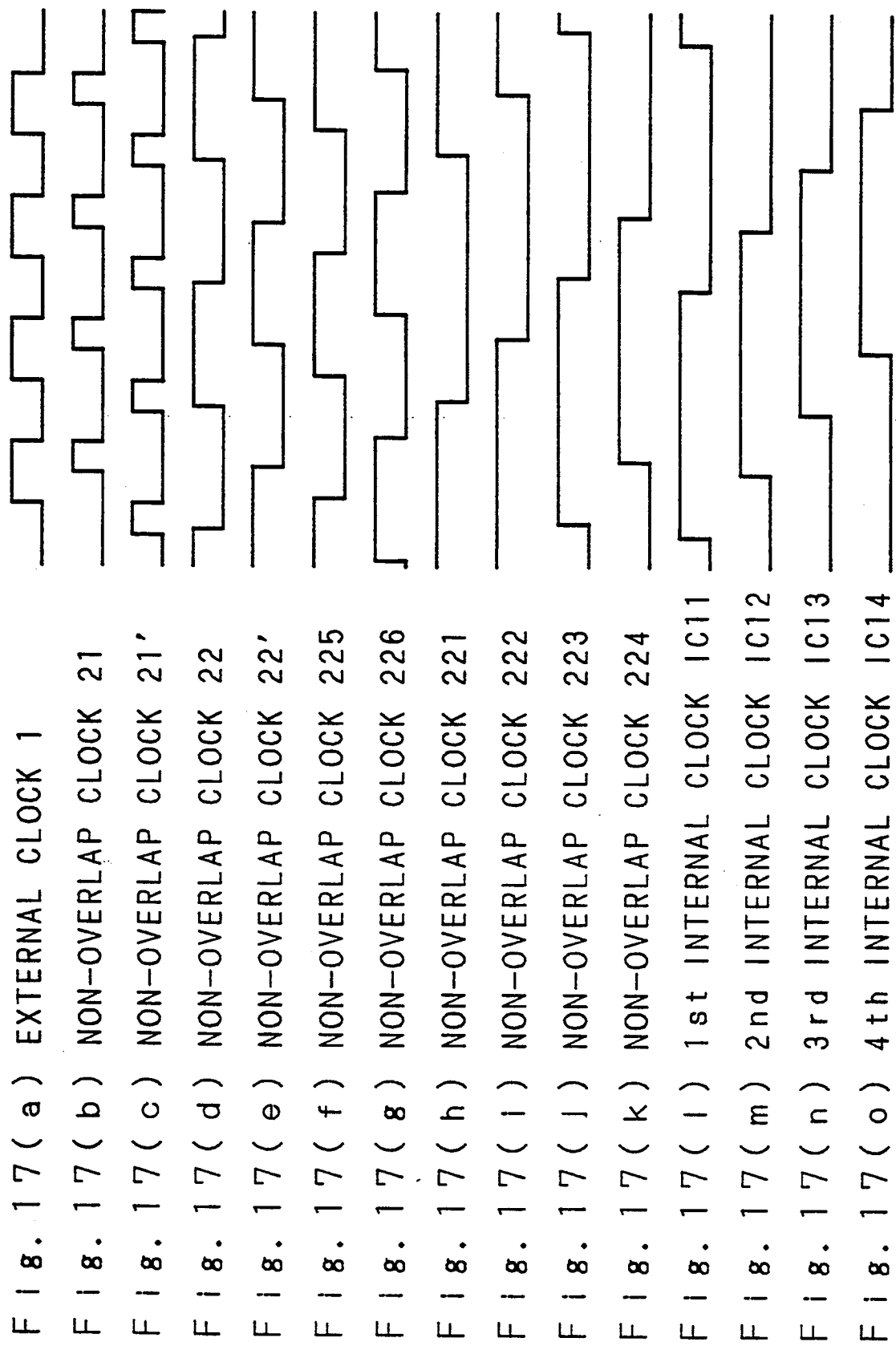
FIG. 17 is a timing chart showing a waveform of each clock of the first invention of the above-mentioned clock generator of the invention.

In the example of construction shown in the block diagram of FIG. 16, as shown in a timing chart of FIG. 17, the frequency-divided output of the frequency dividing circuit 52 is further frequency-divided by frequency dividing circuit 521 and 522, and by the outputs 221, 222, 223 and 224 thereof, Q outputs and Q̄ outputs of the latches 19 and 19' are latched by latches 191, 192, 193 and 194 to be outputted, respectively. Thereby, the four-phase internal clocks IC11, IC12, IC13 and IC14 are obtained as Q outputs of respective latches 191, 192, 193 and 194.

In addition, Q̄ outputs of the respective latches 191, 192, 193 and 194 are outputted as internal clocks IC11', IC12', IC13', IC14' respectively, eight-phase internal clock is obtained in a construction shown in the block diagram of FIG. 16.

And furthermore, when Q output and $\overline{Q}$ output of respective latches 191, 192, 193 and 194 are latched by eight latches by the clocks obtained by further frequency dividing the frequency-divided clocks 221, 222, 223 and 224 which are the outputs of both of the frequency dividing circuits 521 and 522 by frequency dividing circuits same as the frequency dividing circuits 521 and 522, thereby to be outputted, eight-phase internal clocks are obtained.

In the following, the number of the frequency dividing circuits and that of latches are increased successively in the same way, it is possible to increase the number of phase in the way as 16, 32, 64 and more.

Next, explanation will be given on the second invention of the clock generator of the invention.

Figure 18:
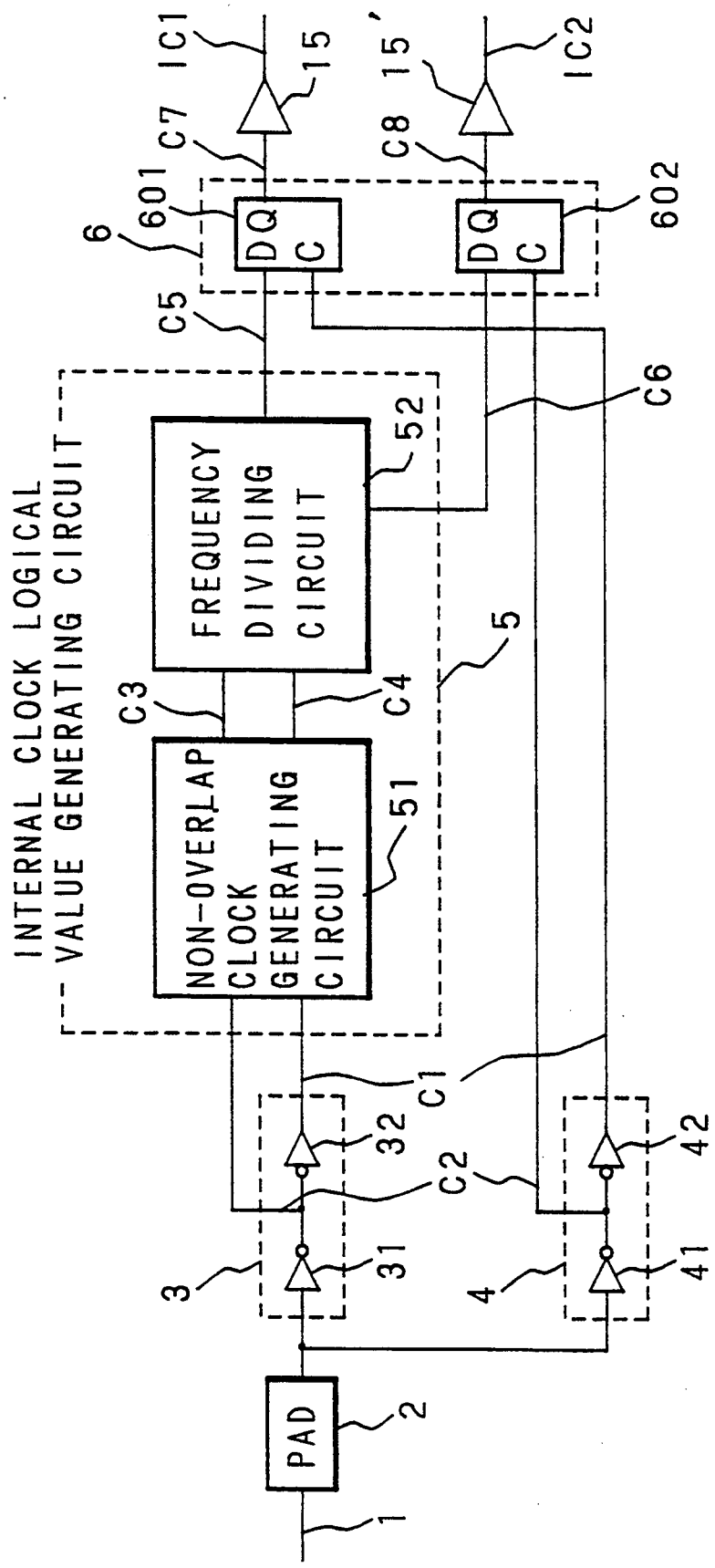
FIG. 18 is a block diagram showing one embodiment of the second invention of the clock generator related to the invention.

FIG. 18 is a block diagram showing a construction of one example of the second invention of the clock generator related to the invention, and the portions of the same symbols as in FIG. 3 used for explaining the prior art show the same or corresponding portions.

In FIG. 18, reference numeral 1 designates external clock signal and is inputted to a pad 2. The external clock signal 1 outputted from the pad 2 is divided into two, one being inputted as a first clock C1 through inverters 31 and 32 of two stages of a first buffer 3, and the other being inputted directly from the inverter 31 as a second clock C2 to a non-overlap clock generating circuit 51 of an internal clock logical value generating circuit 5, respectively.

In addition, the external clock 1 outputted from the pad 2 is also inputted to a second buffer 4, the output being divided therein. The output of an inverter 41 of the second buffer 4 is inputted intact to a C input terminal of one D latch 602 of an internal clock edge generating circuit 6 to be described later, as well as to a C input terminal of another D latch 601 of the internal clock edge generating circuit 6 through another inverter 42, respectively.

Moreover, as the output of the inverter 41 is quite the same as the first clock C1 being the output of the inverter 31, and the output of the inverter 42 is quite the same as the second clock C2 being the output of the inverter 32, the respective outputs of the inverters 42 and 41 are dealt as the first clock C1 and the second clock C2.

FIG. 4 is a circuit diagram showing a concrete construction of the non-overlap clock generating circuit 51. Both of the first clock C1 and the second clock C2 which have been inputted to the non-overlap clock generating circuit 51 are inputted to a frequency dividing circuit 52, respectively, as a fourth clock C4 and a third clock C3 through NOR gates and inverters of two stages.

FIG. 5 is a circuit diagram showing a concrete construction of the frequency dividing circuit 52. The frequency dividing circuit 52 comprises of D latches D1 and D2 of two stages. The third clock C3 inputted to the frequency dividing circuit 52 is outputted as a sixth clock C6 through one D latch D1, and the fourth clock C4 inputted to the frequency dividing circuit 52 is outputted as a fifth clock C5 through the other D latch D2, respectively.

The fifth clock C5 and the sixth clock C6 outputted from the frequency dividing circuit 52 are inputted to the internal clock edge generating circuit 6.

The internal clock edge generating circuit 6 comprises of two D latches 601 and 602, and latches the fifth clock C5 and the sixth clock C6 by the first clock C1 and the second clock C2 obtained by being divided into two after the external clock 1 is outputted to the pad 2. A seventh clock C7 and an eighth clock C8 being latch outputs of D latches 601 and 602 are buffered by the internal clock output buffers 15 and 15', and outputted as a first internal clock IC1 and a second internal clock IC2.

Figure 19:
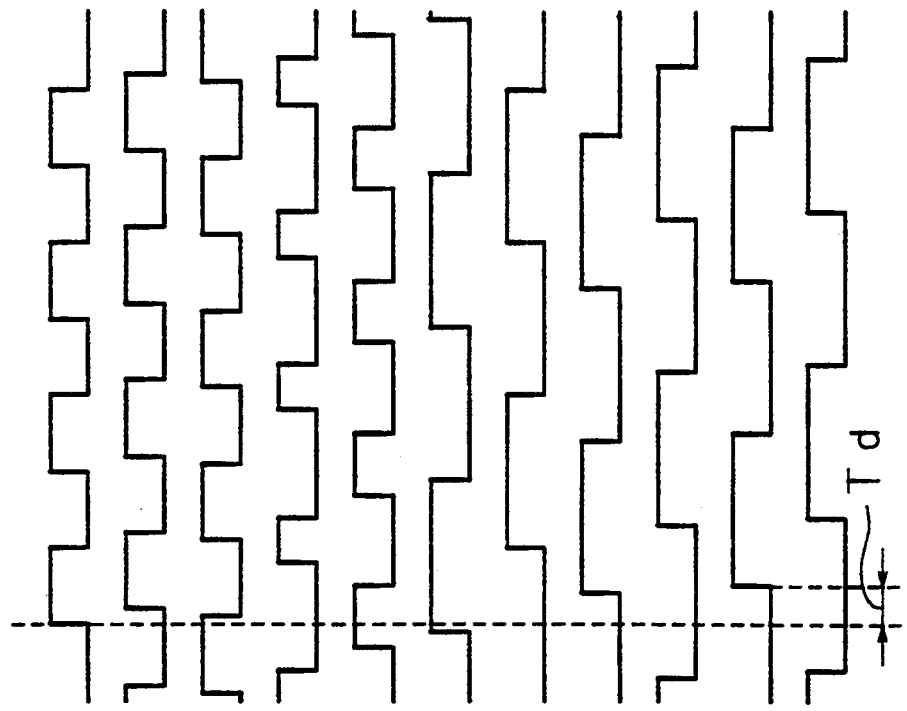
FIG. 19 is a timing chart showing a waveform of each clock of the second invention of the above-mentioned clock generator of the invention.

FIG. 19 is a timing chart showing a waveform of each clock of the second invention of the above-mentioned clock generator of the invention.

When compared with the external clock 1 shown in FIG. 19(a), the second clock C2 through the inverter 31 is inverted and delayed a little, as shown in FIG. 19(c), and the first clock C1 through the inverters 31 and 32 of two stages of the first buffer 3 is inverted two times and delayed about two times of the second clock C2, as shown in FIG. 19(b).

The fourth clock C4 shown in FIG. 19(e) is delayed by the time required for the first clock C1 passing through a NOR gate and two inverters, and the third clock C3 shown in FIG. 19(d) is generated in the non-overlap state with the fourth clock C4.

And the sixth clock C6 shown in FIG. 19(g) is generated from the third clock C3 due to the delay corresponding to one D latch, and the fifth clock C5 shown in FIG. 19(f) is generated from the fourth clock C4 due to the delay corresponding to one D latch, respectively.

The fifth clock C5 is latched by the first clock C1 outputted from the inverter 42, and the sixth clock C6 is latched by the second clock C2 outputted from the inverter 41, respectively, at the D latch 601 and 602 of the internal clock edge generating circuit 6. As a result, from the D latch 601 and 602, the seventh clock C7 shown in FIG. 19(h) and the eighth clock C8 shown in FIG. 19(i) are outputted, respectively, and outputted as the first internal clock IC1 and the second internal clock IC2, respectively, through the internal clock output buffer 15 and 15'.

In this way, in the internal clock edge generating circuit 6, as the fifth clock C5 and the sixth clock C6 are respectively latched by the first clock C1 and the second clock C2 whose time delay is smaller than that of the external clock 1, the delay in the internal clock logical value generating circuit 5 does not effect to the first internal clock IC1 and the second internal clock IC2. The one which gives effect to the first internal clock IC1 and the second internal clock IC2 is only the delay at the inverters 41 and 42 of the second buffer 4 relative to the external clock 1 and the delay at the internal clock edge generating circuit 6.

In addition, the output of the inverters 41 and 42 of the second buffer 4 are given only to the internal clock edge generating circuit 6, and the output of the internal clock edge generating circuit 6 is given only to the internal clock output buffer 15, either load is relatively light. Accordingly, it is relatively easy to modify that to be operated at high speed, and thereby it is also possible to reduce more the delay of the first internal clock IC1 and the second internal clock IC2 relative to the external clock 1.

Moreover, when the external clock 1 is divided into the first buffer 3 comprising of the inverters 31 and 32 and the second buffer 4 comprising of the inverters 41 and 42, though the load of the external clock 1 is increased, it is out of problem that the load of the external clock 1 is increased as a result of adding the second buffer 4 because the load due to the second buffer 4 is small compared with that of the first buffer 3, and compared with the whole load of the external clock 1.

Figure 20:
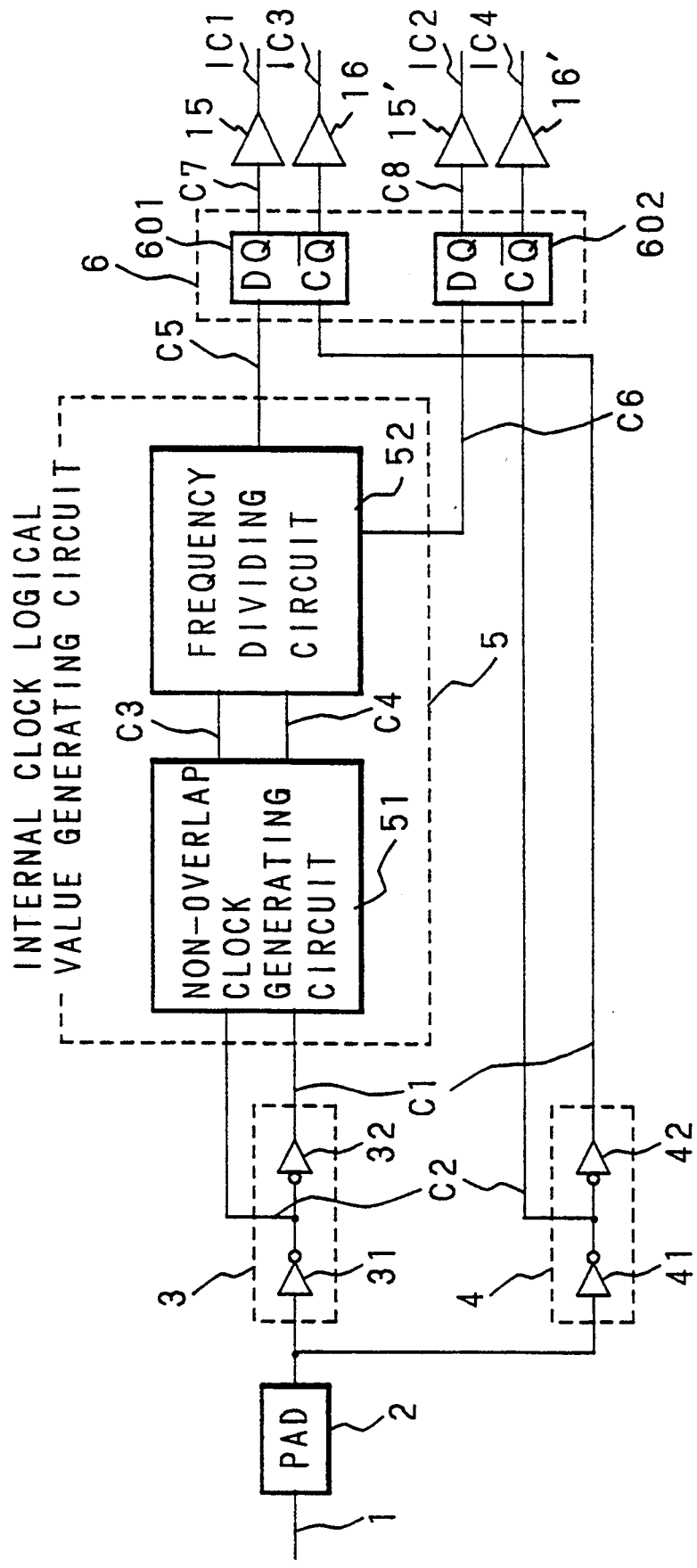
FIG. 20 is a block diagram showing an example of construction in the case where the output clock of the clock generator of second invention is made to be four-phase.

FIG. 20 is a block diagram showing an example of construction in the case where the output clock of the clock generator of aforementioned second invention is made to be four-phase.

In the example of construction shown in the block diagram of FIG. 20, in the same way as the case of aforementioned first invention, four-phase output clock is obtained by outputting respective Q outputs of both of the latches 19 and 19' are outputted as third and fourth internal clocks IC3 and IC4 respectively through output buffers 16 and 16'.

FIG. 21 is a block diagram showing another example of construction in the case where the output clock of the clock generator of aforementioned second invention is made to be four-phase.

As the construction shown in FIG. 21 is same as that shown in FIG. 16 in which aforementioned first invention is made to be four-phase, and the timing chart is same as FIG. 17, explanation thereof will be omitted. Furthermore, as same as construction of FIG. 16, phase numbers of output clock can be increased in the way as 16, 32, 64 and more.

As above-mentioned, according to the first invention of the clock generator related to the invention, in the clock generator being provided with a circuit which generates non-overlap clock from input clock, and a frequency dividing circuit which is driven by the non-overlap clock being the output of the above circuit, a latch means is disposed between the frequency dividing circuit and the clock driver so that the frequency-divided output is sampled in the latch means by the input clock and is driven through a clock driver. According to such a construction, the critical pass which brings about the delay from the source input clock to the output clock is;

input clock→
latch means→
clock driver
   shortening the pass, as compared with that of the conventional clock generator by corresponding to number of gates of each latch smaller than that of each flip-flop;

input clock→
flip-flop→
clock driver.

And, as it substantially bypasses the non-overlap clock generating circuit whose time delay is especially large, the time delay between the input clock and output clock can be shortened largely.

In addition, according to the second invention, as an internal clock edge generating circuit which is required to operate at high speed is added to an internal clock logical value generating circuit, and an initial stage of a buffer which inputs external clock is divided to be supplied to the internal clock edge generating circuit which is required to operate at high speed and to the other circuits, capacity of the buffer in the circuit required to operate at high speed is decreased, thereby the delay of the external clock is decreased.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A clock generator for generating a plurality of output clock signals and for reducing a delay between an input source clock signal and said plurality of output clock signals, comprising:

a non-overlap clock generating circuit, which inputs said source clock signal and generates a first non-overlap clock signal and a second non-overlap clock signal;

a frequency dividing circuit coupled to said non-overlap clock generating circuit, wherein said frequency dividing circuit inputs said first non-overlap clock signal and said second non-overlap clock signal, and wherein said frequency dividing circuit generates a plurality of divided clock signals obtained by frequency dividing said first non-overlap clock signal and said second non-overlap clock signal in half;

a first latch coupled to a first output of said frequency dividing circuit, wherein said first latch inputs at least one of said plurality of divided clock signals, and wherein said first latch generates a first plurality of latched clock signals and a corresponding first plurality of inverted latched clock signals by latching said plurality of divided clock signals using said source clock signal as a latch clock;

a second latch coupled to a second output of said frequency dividing circuit, wherein said second latch inputs at least one of said plurality of divided clock signals, and wherein said second latch generates a second plurality of latched clock signals and a corresponding second plurality of inverted latched clock signals by latching said plurality of divided clock signals using an inverted source clock signal as a latch clock, said inverted source clock signal being a logical inverse of said source clock signal; and a clock driver circuit coupled to said first latch and said second latch, wherein said clock driver circuit inputs at least one of said first plurality of latched clock signals and at least one of said second plurality of latched clock signals, and wherein said clock driver circuit drives said plurality of output clock signals.

2. A clock generator as disclosed in claim 1, further comprising:

an inverted clock driver circuit coupled to said first latch and said second latch, wherein said inverted clock driver circuit inputs at least one of said first plurality of inverted latched clock signals and at least one of said second plurality of inverted latched clock signals, and wherein said inverted clock driver circuit drives a plurality of inverted output clock signals.

3. A clock generator, comprising:

a non-overlap clock generating circuit which inputs a source clock signal and generates a first non-overlap clock signal and a second non-overlap clock signal;

a first frequency dividing circuit coupled to said non-overlap clock generating circuit, wherein said first frequency dividing circuit inputs said first non-overlap clock signal and said second non-overlap clock signal, and wherein said first frequency dividing circuit generates a plurality of divided clock signals obtained by frequency dividing said first non-overlap clock signal and said second non-overlap clock signal in half;

first latch means coupled to said first frequency dividing circuit, wherein said first latch means inputs at least one of said plurality of divided clock signals and wherein said first latch means generates a first plurality of latched clock signals and a corresponding first plurality of inverted latch clock signals by latching said plurality of divided clock signals using said source clock signal as a latch clock;

second latch means coupled to said first frequency dividing circuit, wherein said second latch means inputs at least one of said plurality of divided clock signals, and wherein said second latch means generates a second plurality of latched clock signals and a corresponding second plurality of inverted latched clock signals by latching said plurality of divided clock signals using an inverted source clock signal as a latch clock, said inverted source clock signal being a logical inverse of said source clock signal;

a second frequency dividing circuit coupled to said first frequency dividing circuit, wherein said second frequency dividing circuit inputs at least one of said plurality of divided clock signals, and wherein said second frequency dividing circuit generates a second plurality of divided clock signals by frequency dividing said plurality of divided clock signals in half;

a third frequency dividing circuit coupled to said first frequency dividing circuit, wherein said third frequency dividing circuit inputs at least one of said plurality of divided clock signals, and wherein said third frequency dividing circuit generates a third plurality of divided clock signals by frequency dividing said plurality of divided clock signals in half;

third latch means coupled to said second frequency dividing circuit, coupled to said third frequency dividing circuit, coupled to said first latch means, and coupled to said second latch means, wherein said third latch means comprises four latches and each of said four latches in said third latch means inputs at least one of said second plurality of divided clock signals and said third plurality of divided clock signals, and wherein each of said four latches in said third latch means generates a third plurality of latched clock signals and a corresponding third plurality of inverted latched clock signals by latching said second plurality of divided clock signals and latching said third plurality of divided clock signals using said first plurality of latched clock signals as latch clocks and using said second plurality of latched clock signals as latch clocks; and a clock driver circuit coupled to said third latch means, wherein said clock driver circuit inputs at least one of said third plurality of latched clock signals, and wherein said clock driver circuit drives a plurality of output clock signals.

4. A clock generator as disclosed in claim 3, further comprising:

an inverted clock driver circuit coupled to said third latch means, wherein said inverted clock driver circuit inputs at least one of said third plurality of inverted latched clock signals, and wherein said inverted clock driver circuit drives a plurality of inverted output clock signals.

5. A clock generator for generating a plurality of output clock signals and for reducing a delay between an input source clock signal and said plurality of output clock signals, comprising:

a first input buffer and a second input buffer, each of which inputs said source clock signal and generates a clock signal and a corresponding inverted clock signal;

a non-overlap clock generating circuit, coupled to said first input buffer, wherein said non-overlap clock generating circuit inputs said clock signal and said inverted clock signal, and wherein said non-overlap clock generating circuit generates a first non-overlap clock signal and a second non-overlap clock signal;

a frequency dividing circuit coupled to said non-overlap clock generating circuit, wherein said frequency dividing circuit inputs said first non-overlap clock signal and said second non-overlap clock signals, and wherein said frequency dividing circuit generates a plurality of divided clock signals obtained by frequency dividing said first non-overlap clock signal and said second non-overlap clock signal in half;

a first latch coupled to a first output of said frequency dividing circuit and coupled to said second input buffer, wherein said first latch inputs at least one of said plurality of divided clock signals, and wherein said first latch generates a first plurality of latched clock signals and a corresponding first plurality of inverted latched clock signals by latching said plurality of divided clock signals using said clock signal as a latch clock;

a second latch coupled to a second output of said frequency dividing circuit and coupled to said second input buffer, wherein said second latch inputs at least one of said plurality of divided clock signals, and wherein said second latch generates a second plurality of latched clock signals and a corresponding second plurality of inverted latched clock signals by latching said plurality of divided clock signals using said inverted clock signal as a latch clock; and a clock driver circuit coupled to said first latch and said second latch, wherein said clock driver circuit inputs at least one of said first plurality of latched clock signals and at least one of said second plurality of latched clock signals, and wherein said clock driver circuit drives said plurality of output clock signals.

6. A clock generator as disclosed in claim 5, further comprising:

an inverted clock driver circuit coupled to said first latch and said second latch, wherein said inverted clock driver circuit inputs at least one of said first plurality of inverted latched clock signals and at least one of said second plurality of inverted latched clock signals, and wherein said inverted clock driver circuit drives a plurality of inverted output clock signals.

7. A clock generator, comprising:

a first input buffer and a second input buffer, each of which inputs a source clock signal and generates a clock signal and a corresponding inverted clock signal;

a non-overlap clock generating circuit, coupled to said first input buffer, wherein said non-overlap clock generating circuit inputs said clock signal and said inverted clock signal, and wherein said non-overlap clock generating circuit generates a first non-overlap clock signal and a second non-overlap clock signal;

a first frequency dividing circuit coupled to said non-overlap clock generating circuit, wherein said first frequency dividing circuit inputs said first non-overlap clock signal and said second non-overlap clock signals, and wherein said first frequency dividing circuit generates a plurality of divided clock signals obtained by frequency dividing said first non-overlap clock signal and said second non-overlap clock signal in half;

first latch means coupled to said first frequency dividing circuit and coupled to said second input buffer, wherein said first latch means inputs at least one of said plurality of divided clock signals, and wherein said first latch means generates a first plurality of latched clock signals by latching said plurality of divided clock signals using said clock signal as a latch clock;

second latch means coupled to said first frequency dividing circuit and coupled to said second input buffer, wherein said second latch inputs at least one of said plurality of divided clock signals, and wherein said second latch means generates a second plurality of latched clock signals by latching said plurality of divided clock signals using said inverted clock signal as a latch clock; and a second frequency dividing circuit coupled to said first frequency dividing circuit, wherein said second frequency dividing circuit inputs at least one of said plurality of divided clock signals, and wherein said second frequency dividing circuit generates a second plurality of divided clock signals by frequency dividing said plurality of divided clock signals in half;

a third frequency dividing circuit coupled to said first frequency dividing circuit, wherein said third frequency dividing circuit inputs at least one of said plurality of divided clock signals, and wherein said third frequency dividing circuit generates a third plurality of divided clock signals by frequency dividing said plurality of divided clock signals in half;

third latch means coupled to said second frequency dividing circuit, coupled to said third frequency dividing circuit, coupled to said first latch means, and coupled to said second latch means, wherein said third latch means comprises four latches and each of said four latches in said third latch means inputs at least one of said second plurality of divided clock signals and said third plurality of divided clock signals, and wherein each of said four latches in said third latch means generates a third plurality of latched clock signals and a corresponding third plurality of inverted latched clock signals by latching said second plurality of divided clock signals and latching said third plurality of divided clock signals using said first plurality of latched clock signals as latch clocks and using said second plurality of latched clock signals as latch clocks;

a clock driver circuit coupled to said third latch means, wherein said clock driver circuit inputs at least one of said third plurality of latched clock signals, and wherein said clock driver circuit drives a plurality of output clock signals.

8. A clock generator as disclosed in claim 7, further comprising:
an inverted clock driver circuit coupled to said third latch means, wherein said inverted clock driver circuit inputs at least one of said third plurality of inverted latched clock signals, and wherein said inverted clock driver circuit drives a plurality of inverted output clock signals.

9. A clock generator, comprising:
a non-overlap clock generating circuit which inputs a source clock signal and generates a first non-overlap clock signal and a second non-overlap clock signal;

a first frequency dividing circuit coupled to said non-overlap clock generating circuit, wherein said first frequency dividing circuit inputs said first non-overlap clock signal, and said second non-overlap clock signal and generates a first plurality of divided clock signals obtained by frequency dividing said first non-overlap clock signal and said second non-overlap clock signal in half;

a first latch coupled to said first frequency dividing circuit, wherein said first latch inputs at least one of said first plurality of divided clock signals, and wherein said first latch generates a first plurality of latched clock signals and a first plurality of inverted latch clock signals by latching said first plurality of divided clock signals using said source clock signal as a latch clock;

a second latch coupled to said first frequency dividing circuit, wherein said second latch inputs at least one of said first plurality of divided clock signals, and wherein said second latch generates a second plurality of latched clock signals and a second plurality of inverted latch clock signals by latching said first plurality of divided clock signals using an inverted source clock signal as a latch clock, said inverted source clock signal being a logical inverse of said source clock signal;

a second frequency dividing circuit coupled to said first frequency dividing circuit, wherein said second frequency dividing circuit inputs at least one of said first plurality of divided clock signals, and wherein said second frequency dividing circuit generates a second plurality of divided clock signals by frequency dividing said first plurality of divided clock signals in half;

a third frequency dividing circuit coupled to said first frequency dividing circuit, wherein said third frequency dividing circuit inputs at least one of said first plurality of divided clock signals, and wherein said third frequency dividing circuit generates a third plurality of divided clock signals by frequency dividing said first plurality of divided clock signals in half;

a third latch coupled to said second frequency dividing circuit and coupled to said second latch, wherein said third latch inputs at least one of said second plurality of divided clock signals, and wherein said third latch generates a third plurality of latched clock signals and a corresponding third plurality of inverted latched clock signals by latching said second plurality of divided clock signals using one of said second plurality of latched clock signals as a latch clock;

a fourth latch coupled to said second frequency dividing circuit and coupled to said first latch, wherein said fourth latch inputs at least one of said second plurality of divided clock signals, and wherein said fourth latch generates a fourth plurality of latched clock signals and a corresponding fourth plurality of inverted latched clock signals by latching said second plurality of divided clock signals using one of said first plurality of inverted latched clock signals as a latch clock;

a fifth latch coupled to said third frequency dividing circuit and coupled to said second latch, wherein said fifth latch inputs at least one of said third plurality of divided clock signals, and wherein said fifth latch generates a fifth plurality of latched clock signals and a corresponding fifth plurality of inverted latched clock signals by latching said third plurality of divided clock signals using one of said second plurality of inverted latched clock signals as a latch clock;

a sixth latch coupled to said third frequency dividing circuit and coupled to said first latch, wherein said sixth latch inputs at least one of said third plurality of divided clock signals, and wherein said sixth latch generates a sixth plurality of latched clock signals and a corresponding sixth plurality of inverted latched clock signals by latching said third plurality of divided clock signals using one of said first plurality of latched clock signals as a latch clock; and a clock driver circuit coupled to said third latch, coupled to said fourth latch, coupled to said fifth latch, and coupled to said sixth latch, wherein said clock driver circuit inputs at least one of said third plurality of latched clock signals, at least one of said fourth plurality of latched clock signals, at least one of said fifth plurality of latched clock signals, and at least one of said sixth plurality of latched clock signals, and wherein said clock driver circuit drives a plurality of output clock signals.

10. A clock generator as disclosed in claim 9, further comprising:

an inverted clock driver circuit coupled to said third latch, coupled to said fourth latch, coupled to said fifth latch, and coupled to said sixth latch, wherein said inverted clock driver circuit inputs at least one of said third plurality of inverted latched clock signals, at least one of said fourth plurality of inverted latched clock signals, at least one of said fifth plurality of inverted latched clock signals, and at least one of said sixth plurality of inverted latched clock signals, and wherein said inverted clock driver circuit drives a plurality of inverted output clock signals.

* * * * *